(12) United States Patent
Han et al.

(10) Patent No.: US 9,063,411 B2
(45) Date of Patent: *Jun. 23, 2015

(54) ADDITIVE FOR RESIST AND RESIST COMPOSITION COMPRISING SAME

(71) Applicant: KOREA KUMHO PETROCHEMICAL CO., LTD., Seoul (JP)

(72) Inventors: Joon Hee Han, Namyangju-si (KR); Hyun Sang Joo, Daejeon (KR); Jin Ho Kim, Asan-si (KR); Hyun Soon Lim, Asan-si (KR)

(73) Assignee: KOREA KUMHO PETROCHEMICAL CO., LTD., Seoul (KR)

( * ) Notice: Subject to any disclaimer, the term of this patent is extended or adjusted under 35 U.S.C. 154(b) by 90 days.

This patent is subject to a terminal disclaimer.

(21) Appl. No.: 13/714,154

(22) Filed: Dec. 13, 2012

(65) Prior Publication Data
US 2013/0171561 A1    Jul. 4, 2013

(30) Foreign Application Priority Data
Dec. 28, 2011 (KR) .................. 10-2011-0144954

(51) Int. Cl.
| G03F 7/039 | (2006.01) |
| --- | --- |
| G03F 7/20 | (2006.01) |
| G03F 7/004 | (2006.01) |
| C08F 132/08 | (2006.01) |
| C08F 220/18 | (2006.01) |
| C08F 220/22 | (2006.01) |
| C08F 232/08 | (2006.01) |
| G03F 7/11 | (2006.01) |

(52) U.S. Cl.
CPC .............. *G03F 7/004* (2013.01); *C08F 132/08* (2013.01); *C08F 220/18* (2013.01); *C08F 220/22* (2013.01); *C08F 232/08* (2013.01); *G03F 7/0045* (2013.01); *G03F 7/0397* (2013.01); *G03F 7/11* (2013.01); *G03F 7/2041* (2013.01)

(58) Field of Classification Search
CPC ....... G03F 7/004; G03F 7/0046; G03F 7/039; G03F 7/0395; G03F 7/0397; G03F 7/20
USPC .................. 526/245, 271, 280, 318, 319; 430/270.1, 326, 905, 910
See application file for complete search history.

(56) References Cited

U.S. PATENT DOCUMENTS

| 5,523,380 | A | * | 6/1996 | Tahara et al. .................. 528/271 |
| 6,103,845 | A | | 8/2000 | Choi et al. |
| 6,579,659 | B2 | * | 6/2003 | Uetani et al. ................ 430/270.1 |
| 2004/0072097 | A1 | * | 4/2004 | Kodama ...................... 430/270.1 |
| 2013/0171560 | A1 | * | 7/2013 | Shin et al. ................... 430/270.1 |

FOREIGN PATENT DOCUMENTS

| EP | 0 794 458 | A2 | | 9/1997 |
| EP | 0 921 439 | A1 | | 6/1999 |
| EP | 1 162 506 | A1 | | 12/2001 |
| GB | 2 356 258 | A | * | 5/2001 |
| TW | 552476 | | | 9/2003 |
| TW | 201113299 | | | 4/2011 |
| TW | 201142507 | | | 12/2011 |

OTHER PUBLICATIONS

Kim S, et al., Terpolymer of Maleic Anhydride and Cycloolefin Derivatives as an Arf photoresist, Proceedings of SPIE—The International Society for Optical Engineering, 1997, vol. 3049, pp. 430-436.

* cited by examiner

*Primary Examiner* — Anca Eoff
(74) *Attorney, Agent, or Firm* — Birch, Stewart, Kolasch & Birch, LLP

(57) ABSTRACT

A resist additive represented by Formula 1 below and a resist composition including the additive are disclosed. The resist additive improves hydrophobicity of the surface of the resist film to prevent materials from being leached in water during exposure of immersion lithography and is converted to have hydrophilicity by deprotection reaction during development. As a result, a micropattern of a resist film with excellent sensitivity and high resolution is formed.

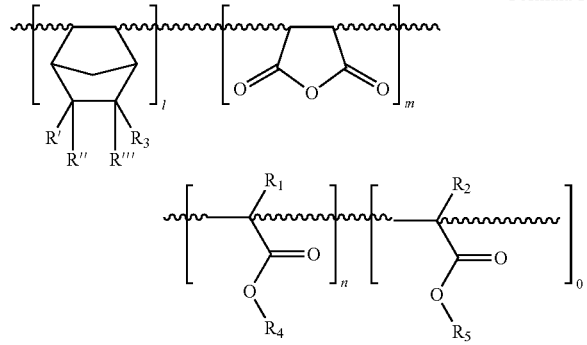

Formula 1

In Formula 1, the substituents are defined as described in the specification.

18 Claims, No Drawings

ADDITIVE FOR RESIST AND RESIST COMPOSITION COMPRISING SAME

BACKGROUND OF THE INVENTION

1. Field of the Invention

The present invention relates to a resist additive which improves hydrophobicity of the surface of a resist film to prevent materials from being leached from the resist film in water during an immersion lithography process and is converted to have hydrophilicity by deprotection reaction during a development process, and a resist composition including the resist additive.

2. Description of the Related Art

With higher integration and higher speed of large scale integrated circuits (LSI) in recent years, accurate micropatterning of photoresist is required. As exposure light sources used in the formation of resist patterns, a g-line (436 nm) or i-line (365 nm) from a mercury lamp has been widely used.

However, as resolution improvement obtained by adjusting exposure wavelength approaches physical limits, a method of using shorter wavelength was introduced as a finer patterning technology of a photoresist. For example, a KrF excimer laser (248 nm), an ArF excimer laser, or the like having a shorter wavelength than i-line (365 nm) is being used.

In ArF immersion lithography using an ArF excimer laser as a light source, the space between a projection lens and a wafer substrate is filled with water. According to this method, a pattern may be formed using a refractive index of water at 193 nm even when a lens having an NA of 1.0 or greater is used, and this method is commonly referred to as immersion lithography. However, since a resist film directly contacts water, acids generated by a photoacid generator or amine compounds contained in the resist film as a quencher may be easily dissolved in water. Thus, the resist pattern may be deformed or may collapse due to swelling, or various defects such as bubbles and watermarks may be generated.

Accordingly, a method of forming a protective film or an upper film between the resist film and water to prevent the resist film from coming in contact with a medium such as water has been introduced. Such resist protective films need to be formed on a resist film while having sufficient light transmittance at the exposure wavelength so as not to interrupt exposure without being intermixed with the resist film, need to have and maintain stability without being leached by a medium such as water during liquid immersion lithography, and need to be easily dissolved in an alkali solution that is a developer during development.

PRIOR ART

Patent Document 1: Korean Patent Application Publication No. 2011-0084848 (published on Jul. 26, 2011)
Patent Document 2: Korean Patent Application Publication No. 2007-0072895 (published on Jul. 6, 2007)
Patent Document 3: Korean Patent Application Publication No. 2007-0079009 (published on Aug. 3, 2007)
Patent Document 4: Korean Patent Application Publication No. 2008-0000522 (published on Jan. 2, 2008)

SUMMARY OF THE INVENTION

Therefore, the present invention has been made in view of the above problems, and it is an object of the present invention to provide a resist additive which improves hydrophobicity of the surface of a resist film to prevent materials from being leached from the resist film in water during an immersion lithography process and is converted to have hydrophilicity by deprotection reaction during a development process.

It is another object of the present invention to provide a resist composition including the resist additive and a method of forming a resist pattern using the resist composition.

In accordance with the present invention, the above and other objects can be accomplished by the provision of a resist additive represented by Formula 1 below.

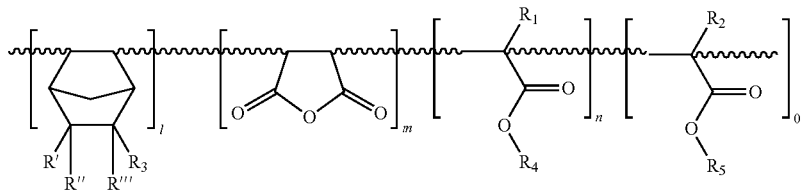

Formula 1

In Formula 1, R', R" and R''' may be each independently selected from the group consisting of a hydrogen atom, a C1-C4 alkyl group, a halogen group, and a C1-C4 haloalkyl group in which one hydrogen atom is substituted with a halogen group.

$R_1$ and $R_2$ may be each independently a hydrogen atom or a C1-C8 alkyl group.

$R_3$ is a hydrogen atom or a functional group represented by Formula 2 below:

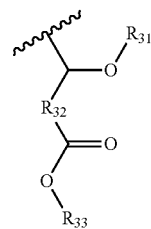

Formula 2

In Formula 2, $R_{31}$ may be a hydrogen atom, or a hydroxyl protecting group selected from the group consisting of a C1-C20 alkyl group, a (C1-C20 alkoxy)alkyl group, a C3-C30 cycloalkyl group, a formyl group, a (C1-C20 alkyl)carbonyl group, a (C3-C30 cycloalkyl)carbonyl group, a (C1-C20 alkyl)carboxyl group, and a (C3-C30 cycloalkyl)carboxyl group, $R_{32}$ may be selected from the group consisting of a C1-C20 alkanediyl group, a C2-C20 alkenediyl group, a C1-C20 heteroalkanediyl group, a C2-C20 heteroalkenediyl group, a C3-C30 cycloalkanediyl group, a C3-C30 cycloalkenediyl group, a C2-C30 heterocycloalkanediyl group, and a C3-C30 heterocycloalkanediyl group, and $R_{33}$ may be an acid labile group selected from the group consisting of

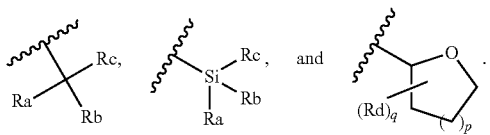 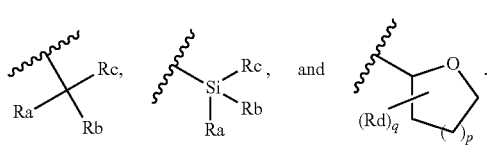

Here, $R_a$, $R_b$, $R_c$ and $R_d$ may be each independently selected from the group consisting of a C1-C20 alkyl group, a C3-C30 cycloalkyl group, a (C1-C10 alkyl)cycloalkyl group, a hydroxyalkyl group, a C1-C20 alkoxy group, a (C1-C10 alkoxy)alkyl group, an acetyl group, an acetylalkyl group, a carboxyl group, a (C1-C10 alkyl)carboxyl group, a (C3-C18 cycloalkyl)carboxyl group, and a C3-C30 heterocycloalkyl group or fused together between adjacent groups to form a C3-C30 saturated or unsaturated hydrocarbon ring or a C2-C20 heterocyclic group, p may be an integer of 0 to 3, and q may be an integer of 0 to 10.

$R_4$ may be selected from the group consisting of a hydrophobic group, and a C1-C20 alkyl group, a C3-C30 cycloalkyl group, an acyl group, a carboxyl group, a (C1-C20 alkyl)carboxyl group, a (C3-C30 cycloalkyl)carboxyl group, a C1-C20 heteroalkyl group, and a C2-C30 heterocycloalkyl group including the hydrophobic group.

$R_5$ may be an acid labile group selected from the group consisting of

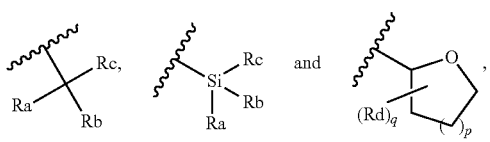

wherein $R_a$, $R_b$, $R_c$ and $R_d$ are defined as described above, or selected from the group consisting of a C1-C20 alkyl group, a C3-C30 cycloalkyl group, an acyl group, a carboxyl group, a (C1-C20 alkyl)carboxyl group, a (C3-C30 cycloalkyl)carboxyl group, a (C1-C20 alkyl)carboxyalkyl group, a C1-C20 heteroalkyl group, and a C2-C30 heterocycloalkyl group including the acid labile group.

Here, l, m, n and o are respectively numbers of the repeat units in a backbone, wherein $l+m+n+o=1$, $0<l/(l+m+n+o)<0.9$, $0<m/(l+m+n+o)\leq0.2$, $0<n/(l+m+n+o)<0.9$, and $0\leq o/(l+m+n+o)<0.9$.

The hydrophobic group may be selected from the group consisting of a halogen atom and a C1-C20 haloalkyl group.

In Formula 2, $R_{31}$ may be selected from the group consisting of a C1-C10 alkyl group, a (C1-C10 alkoxy)alkyl group, a C3-C14 monocyclic cycloalkyl group, a C8-C18 dicyclic cycloalkyl group, a C10-C30 tricyclic cycloalkyl group, a C10-C30 tetracyclic cycloalkyl group, a formyl group, a (C1-C10 alkyl)carbonyl group, a (C3-C18 cycloalkyl)carbonyl group, a (C1-C10 alkyl)carboxyl group, and a (C3-C18 cycloalkyl)carboxyl group.

In Formula 2, $R_{31}$ may be selected from the group consisting of a formyl group, an acetyl group, a methoxymethyl group, a t-butylcarbonyl group, a t-butyloxycarbonyl group, a cyclohexylcarbonyl group, a cyclopentylcarbonyl group, a cyclooctylcarbonyl group, an adamantylcarbonyl group, and a bicyclo[2,2,1]heptylmethyl carbonyl group.

In Formula 2, $R_{33}$ may be selected from the group consisting of

Here, $R_a$, $R_b$, $R_c$, and $R_d$ may be each independently selected from the group consisting of a C1-C10 alkyl group, a C3-C14 monocyclic cycloalkyl group, a C8-C20 dicyclic cycloalkyl group, a C10-C30 tricyclic cycloalkyl group, a C10-C30 tetracyclic cycloalkyl group, a (C1-C5 alkyl)cycloalkyl group, a hydroxyalkyl group, a C1-C10 alkoxy group, a (C1-C5 alkoxy)alkyl group, an acetyl group, an acetylalkyl group, a carboxyl group, a (C1-C5 alkyl)carboxyl group, and a (C3-C10 cycloalkyl)carboxyl group or fused together between adjacent groups to form a C6-C18 saturated or unsaturated hydrocarbon ring or a C5-C18 heterocyclic group, p may be an integer of 0 to 3, and q may be an integer of 0 to 5.

$R_{33}$ may be selected from the group consisting of a t-butyl group, a trimethylsilyl group, a hydroxy-2-ethyl group, a 1-methoxypropyl group, a 1-methoxy-1-methylethyl group, a 1-ethoxypropyl group, a 1-ethoxy-1-methylethyl group, a 1-methoxy-1-ethyl group, a 1-ethoxy-1-ethyl group, a t-butoxy-2-ethyl group, a 1-isobutoxy-1-ethyl group, and groups represented by Formulae 3a to 3k below.

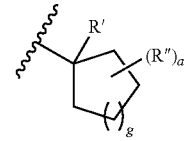

(3a)

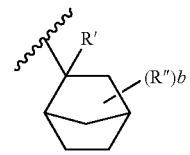

(3b)

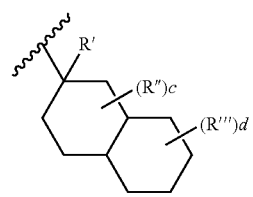

(3c)

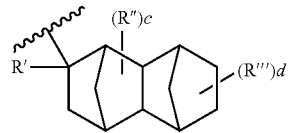

(3d)

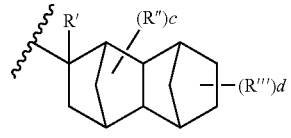

(3e)

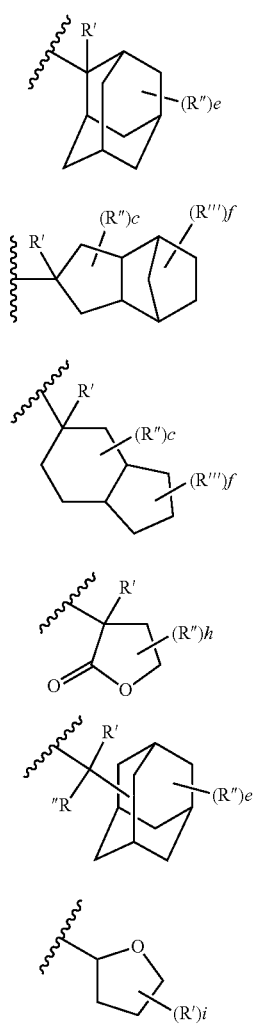

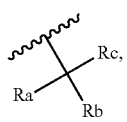 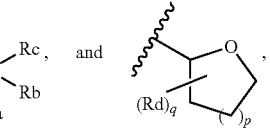

wherein $R_a$, $R_b$, $R_c$, and $R_d$ are each independently selected from the group consisting of a C1-C10 alkyl group, a C3-C14 monocyclic cycloalkyl group, a C8-C20 dicyclic cycloalkyl group, a C10-C30 tricyclic cycloalkyl group, a C10-C30 tetracyclic cycloalkyl group, a (C1-C5 alkyl)cycloalkyl group, a hydroxyalkyl group, a C1-C10 alkoxy group, a (C1-C5 alkoxy)alkyl group, an acetyl group, an acetylalkyl group, a carboxyl group, a (C1-C5 alkyl)carboxyl group, and a (C3-C10 cycloalkyl)carboxyl group or fused together between adjacent groups to form a C6-C18 saturated or unsaturated hydrocarbon ring or a C5-C18 heterocyclic group, p is an integer of 0 to 3, and q is an integer of 0 to 5, or selected from the group consisting of a C1-C10 alkyl group, a C3-C14 monocyclic cycloalkyl group, a C8-C18 dicyclic cycloalkyl group, a C10-C30 tricyclic cycloalkyl group, a C10-C30 tetracyclic cycloalkyl group, a formyl group, a (C1-C20 alkyl) carbonyl group, a (C3-C30 cycloalkyl)carbonyl group, a carboxyl group, a (C1-C10 alkyl)carboxyl group, a (C3-C18 cycloalkyl)carboxyl group, and a (C1-C10 alkyl)carboxyalkyl group including the acid labile group.

In Formula 1, $R_5$ may be selected from the group consisting of a t-butyl group, a trimethylsilyl group, a hydroxy-2-ethyl group, a 1-methoxypropyl group, a 1-methoxy-1-methylethyl group, a 1-ethoxypropyl group, a 1-ethoxy-1-methylethyl group, a 1-methoxy-1-ethyl group, a 1-ethoxy-1-ethyl group, a t-butoxy-2-ethyl group, a 1-isobutoxy-1-ethyl group, and groups represented by Formulae 3a to 3k.

In Formula 1, a repeat unit m may be contained in a copolymer of the resist additive in an amount of 5 to 15 mol %.

The resist additive may be selected from the group consisting of compounds represented by Formulae 5 to 10 below.

In Formulae 3a to 3k, R', R" and R'" may be each independently a hydrogen atom or a C1-C10 alkyl group, a and e may be each independently an integer of 0 to 15, b may be an integer of 0 to 11, c and d may be each independently an integer of 0 to 9, f may be an integer of 0 to 7, g and i may be each independently an integer of 0 to 6, h may be an integer of 0 to 4, 0≤c+d≤17, and 0≤c+f≤15.

In Formula 1, $R_4$ may be selected from the group consisting of: a C1-C20 fluoroalkyl group; and a C1-C20 alkyl group, a C3-C14 monocyclic cycloalkyl group, a C8-C18 dicyclic cycloalkyl group, a C10-C30 tricyclic cycloalkyl group, a C10-C30 tetracyclic cycloalkyl group, a (C1-C10 alkyl)carbonyl group, a (C3-C30 cycloalkyl)carbonyl group, a (C1-C10 alkyl)carboxyl group, a (C1-C20 alkoxy)alkyl group, and a (C3-C30 cycloalkyl)oxyalkyl group including at least one functional group selected from the group consisting of a fluoro group and a fluoroalkyl group.

In Formula 1, $R_4$ may be selected from the group consisting of a trifluoromethyl group, a di(trifluoromethyl)isopropyl group, a pentafluoroethyl group, and a heptafluoropropyl group.

In Formula 1, $R_5$ may be an acid labile group selected from the group consisting of Formula 5

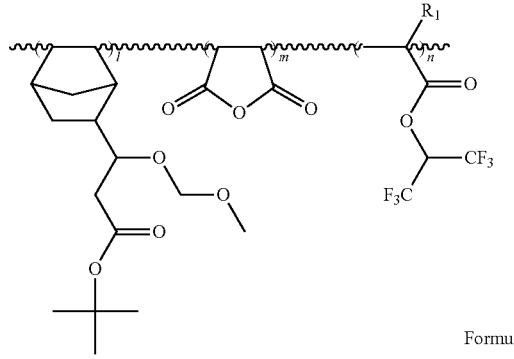

Formula 6

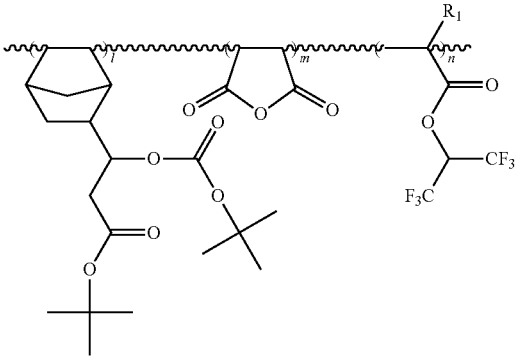

Formula 7

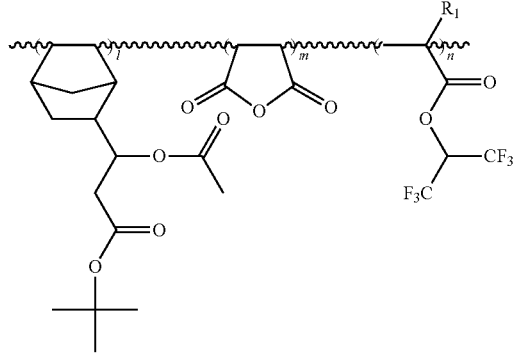

Formula 8

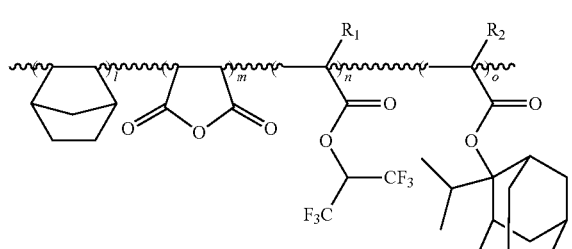

Formula 9

Formula 10

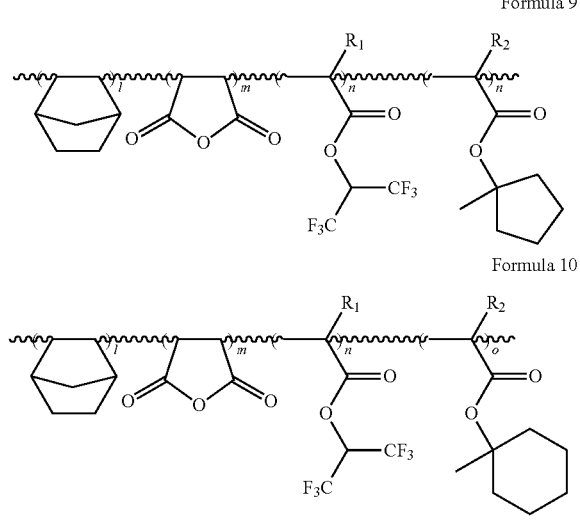

In Formulae 5 to 10, $R_1$ and $R_2$ may be each independently a hydrogen atom or a methyl group, and l, m, n and o are respectively numbers of the repeat unit in a backbone, wherein $l+m+n+o=1$, $0<l/(l+m+n+o)<0.9$, $0<m/(l+m+n+o)\leq 0.2$, $0<n/(l+m+n+o)<0.9$, and $0\leq o/(l+m+n+o)<0.9$.

A polystyrene equivalent weight average molecular weight of the resist additive measured using gel permeation chromatography may be in the range of 1,000 to 50,000 g/mol A ratio of weight average molecular weight/number average molecular weight of the resist additive may be in the range of 1 to 5.

In accordance with an aspect of the present invention, the above and other objects can be accomplished by the provision of a resist composition including the resist additive, a resist base polymer, an acid generator, and a solvent.

The amount of the resist additive may be in the range of 0.05 to 5% by weight based on the total weight of the resist composition.

The acid generator may include at least one compound selected from the group consisting of compounds represented by Formulae 14 and 15 below.

Formula 14

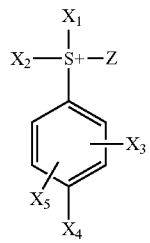

Formula 15

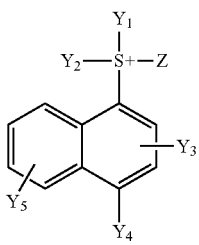

In Formulae 14 and 15, $X_1$, $X_2$, $Y_1$, and $Y_2$ may be each independently selected from the group consisting of a hydrogen atom, a C1-C10 alkyl group, an allyl group, a perfluoroalkyl group, a benzyl group, a C6-C30 aryl group, and any combination thereof, wherein $X_1$ and $X_2$ are fused to form a C3-C30 saturated or unsaturated hydrocarbon ring, and $Y_1$ and $Y_2$ are fused to form a C3-C30 saturated or unsaturated hydrocarbon ring.

$X_3$, $X_4$, $X_5$, $Y_3$, $Y_4$, and $Y_5$ may be each independently selected from the group consisting of a hydrogen atom, a C1-C30 alkyl group, a halogen group, a C1-C30 alkoxy group, a C6-C30 aryl group, a thiophenoxy group, a C1-C30 thioalkoxy group, a C1-C20 alkoxycarbonylmethoxy group, and any combination thereof.

Z, which denotes an anion, may be $OSO_2CF_3$, $OSO_2C_4F_9$, $OSO_2C_8F_{17}$, $N(CF_3)_2$, $N(C_2F_5)_2$, $N(C_4F_9)_2$, $C(CF_3)_3$, $C(C_2F_5)_3$, $C(C_4F_9)_3$, or a functional group represented by Formula 16 below:

Formula 16

$$-O-\underset{\underset{O}{\|}}{\overset{\overset{O}{\|}}{S}}-\underset{V_2}{\overset{V_1}{\underset{|}{\overset{|}{C}}}}-\overset{H_2}{C}-O-W_1-(W_2)o-(W_3)p-W_4$$

In Formula 16, $V_1$ and $V_2$ may be each independently a halogen atom.

$W_1$ may be $-(C=O)-$ or $-(SO_2)-$.

$W_2$ may be a C1-C10 alkanediyl group.

$W_3$ may be selected from the group consisting of a C3-C30 cycloalkyl group, a C6-C30 aryl group, a C7-C30 aralkyl group, a C6-C30 aryloxy group, a C6-C30 arylthio group, and a C5-C30 heterocyclic group.

$W_4$ may be selected from the group consisting of a hydrogen atom, a halogen group, a C1-C10 alkyl group, a C1-C10 alkoxy group, a C1-C10 haloalkyl group, a C1-C10 alkylthio group, a C6-C30 aryl group, and any combination thereof.

Here, o may be an integer of 0 to 1, and p may be an integer of 0 to 2.

The amount of the acid generator may be in the range of 0.3 to 10 parts by weight based on 100 parts by weight of solids of the resist composition.

The resist composition may further include an additive selected from the group consisting of an alkali soluble quencher, an acid diffusion quencher, a surfactant, and any mixture thereof.

In accordance with another aspect of the present invention, there is provided a method of forming a resist pattern including forming a resist film by coating the resist composition on a substrate, heating the resist film, and exposing the resist film to light to form a predetermined pattern, and developing the exposed pattern.

The exposing may be performed using a light source selected from the group consisting of a KrF excimer laser, an ArF excimer laser, an extreme ultraviolet laser, an X-ray, and an electron beam.

Other aspects, features, and advantages of the present invention will be more clearly understood from the following detailed description.

DETAILED DESCRIPTION OF THE INVENTION

Hereinafter, the present invention will be described in detail. However, descriptions of these example embodiments are only provided for illustrative purposes, and should not be construed as limiting the scope and spirit of the present invention. The following detailed description of the present invention is intended to provide further explanation of the invention as claimed.

The term 'halogen atom' as used herein refers to fluorine, chlorine, bromine, or iodine atoms, unless otherwise stated.

The term 'hetero' as used herein is intended to encompass 1 to 3 hetero atoms selected from the group consisting of N, O, S, and P substituting for carbon atoms, unless otherwise stated. For example, the term "heteroalkyl group" refers to an alkyl group in which 1 to 3 carbon atoms are replaced by the hetero atoms.

The term 'alkyl group' as used herein refers to a linear or branched C1-C30 alkyl group, unless otherwise stated, and the alkyl group includes a primary alkyl group, a secondary alkyl group, and a tertiary alkyl group. Examples of the alkyl group include a methyl group, an ethyl group, a propyl group, an isopropyl group, a butyl group, an isobutyl group, and a t-butyl group, but are not limited thereto.

The term 'cycloalkyl group' as used herein refers to a C3-C30 cycloalkyl group, unless otherwise stated, and includes monocyclic, dicyclic, tricyclic, and tetracyclic alkyl groups. The cycloalkyl also includes an adamantyl group, a norbornyl group, and a polycyclic cycloalkyl group including a norbornyl group.

The term 'alkanediyl group' as used herein refers to a divalent atomic group derived from alkanes by removal of two hydrogen atoms and may be represented by the general formula $-C_nH_{2n}-$. The term 'alkenediyl group' as used herein refers to a divalent atomic group derived from alkenes by removal of two hydrogen atoms and may be represented by the general formula $-C_nH_n-$.

The term 'aryl group' as used herein refers to a group including a benzene ring and derivatives thereof, unless otherwise stated. For example, the aryl group includes toluene or xylene consisting of a benzene ring with an alkyl side chain, biphenyl consisting of at least two benzene rings connected via a single bond, fluorene, xanthene or anthraquinone consisting of at least two benzene rings connected via a cycloalkyl group or heterocycloalkyl group, and naphthalene or anthracene consisting of at least two benzene rings condensed to each other. Unless otherwise stated herein, the aryl group refers to a C6-C30 aryl group.

The term 'acyl group' as used herein refers to a group represented by —COR', unless otherwise stated. In this regard, R is selected from the group consisting of a hydrogen atom, an alkyl group, a cycloalkyl group, and an aryl group. The acyl group includes a formyl group, an alkylcarbonyl group, a cycloalkylcarbonyl group, and an arylcarbonyl group. Examples of the acyl group include a formyl group, an acetyl group, and a benzoyl group, but are not limited thereto.

The term 'heterocycle' as used herein refers to a cyclic radical having 4 to 20 ring atoms derived by substituting one or more, e.g., 1, 2, 3 or 4, carbon atoms with hetero atoms, e.g., N, O, P or S, unless otherwise stated. The heterocycle includes a saturated ring, a partially unsaturated ring, and an aromatic ring, i.e., a heteroaromatic ring, having heteroatoms oxidized or quarternized to form, for example, N-oxides or quaternary salts. Substituted heterocycles include a carbonyl group and a heterocyclic ring substituted with any substituent disclosed herein.

Examples of the heterocycles include pyridyl, dihydropyridyl, tetrahydropyridyl(piperidyl), thiazolyl, tetrahydrothiophenyl, sulfur oxidized tetrahydrothiophenyl, pyrimidinyl, furanyl, thienyl, pyrrolyl, pyrazolyl, imidazolyl, tetrazolyl, benzofuranyl, thianaphthalenyl, indolyl, indolenyl, quinolinyl, isoquinolinyl, benzimidazolyl, piperidinyl, 4-piperidonyl, pyrrolidinyl, 2-pyrrolidonyl, pyrrolinyl, tetrahydrofuranyl, tetrahydroquinolinyl, tetrahydroisoquinolinyl, decahydroquinolinyl, octahydroisoquinolinyl, azocinyl, triazinyl, 6H-1,2,5-thiadiazinyl, 2H,6H-1,5,2-dithiazinyl, thienyl, thianthrenyl, pyranyl, isobenzofuranyl, chromenyl, xanthenyl, phenoxathinyl, 2H-pyrrolyl, isothiazolyl, isoxazolyl, pyrazinyl, pyridazinyl, indolizinyl, isoindolyl, 3H-indolyl, 1H-indazoly, purinyl, 4H-quinolizinyl, phthalazinyl, naphthyridinyl, quinoxalinyl, quinazolinyl, cinnolinyl, pteridinyl, 4aH-carbazolyl, carbazolyl, β-carbolinyl, phenanthridinyl, acridinyl, pirimidinyl, phenanthrolinyl, phenazinyl, phenothiazinyl, furazanyl, phenoxazinyl, isochromanyl, chromanyl, imidazolidinyl, imidazolinyl, pyrazolidinyl, pyrazolinyl, piperazinyl, indolinyl, isoindolinyl, quinuclidinyl, morpholinyl, oxazolidinyl, benzotriazolyl, benzisoxazolyl, oxindolyl, benzoxazolinyl, isatinoyl, and bis-tetrahydrofuranyl, which may be substituted or unsubstituted, N-oxides thereof (for example, pyridyl N-oxide and quinolinyl N-oxide) or quaternary salts thereof, but are not limited thereto.

All compounds or substituents used herein may be substituted or unsubstituted, unless stated otherwise. In this regard, the term 'substituted' indicates that hydrogen is substituted with one selected from the group consisting of a halogen atom, a hydroxyl group, a carboxyl group, a cyano group, a nitro group, an amino group, a thio group, a methylthio group, an alkoxy group, a nitrile group, an aldehyde group, an epoxy group, an ether group, an ester group, a carbonyl group, an acetal group, a ketone group, an alkyl group, a perfluoroalkyl group, a cycloalkyl group, a heterocycloalkyl group, an allyl group, a benzyl group, an aryl group, a heteroaryl group, any derivative thereof, and any combination thereof.

The term 'combination thereof' as used herein refers to at least two substituents bound to each other by a single bond or a linking group, or at least two substituents condensed to each other, unless stated otherwise.

Conventionally, when a resist pattern is formed by ArF immersion lithography, water is used in a light path on a photoresist film in order to increase refractive index. However, acids or amine compounds contained in a resist film are dissolved in water disposed between a projection lens and a wafer substrate, and accordingly the projection lens may be contaminated, the resist pattern may be deformed or collapse due to swelling, or various defects such as bubbles and watermarks may be generated.

According to the present invention, a copolymer including a repeat unit having a hydrophobic group at one end of a side chain of the repeat unit is used as an additive for a photoresist composition. Thus, while the resist film is formed, the additive is disposed on the surface of a resist film, as if a separate protective film is formed, to improve hydrophobicity of the surface of the resist film and prevent leaching in water during immersion lithography. The hydrophobic group is converted into a hydrophilic group during development.

That is, a resist additive according to an embodiment of the present invention is a multiblock copolymer represented by Formula 1 below.

Formula 1

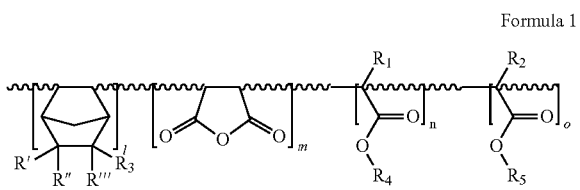

In Formula 1, R', R" and R'" may be each independently selected from the group consisting of a hydrogen atom, a C1-C4 alkyl group, a halogen group and a C1-C4 haloalkyl group in which one hydrogen atom is substituted with a halogen group.

$R_1$ and $R_2$ may be each independently a hydrogen atom or a C1-C8 alkyl group.

$R_3$ may be a hydrogen atom or a functional group represented by Formula 2 below.

Formula 2

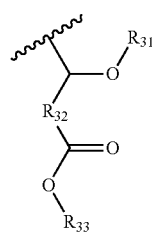

In Formula 2, $R_{31}$ may be a hydrogen atom, or a hydroxyl protecting group selected from the group consisting of a C1-C20 alkyl group, a (C1-C20 alkoxy)alkyl group, a C3-C30 cycloalkyl group, a formyl group, a (C1-C20 alkyl)carbonyl group, a (C3-C30 cycloalkyl)carbonyl group, a (C1-C20 alkyl)carboxyl group, and a (C3-C30 cycloalkyl)carboxyl group. $R_{32}$ may be selected from the group consisting of a C1-C20 alkanediyl group, a C2-C20 alkenediyl group, a C1-C20 heteroalkanediyl group, a C2-C20 heteroalkenediyl group, a C3-C30 cycloalkanediyl group, a C3-C30 cycloalkenediyl group, a C2-C30 heterocycloalkanediyl group, and a C3-C30 heterocycloalkanediyl group. $R_{33}$ may be an acid labile group selected from the group consisting of

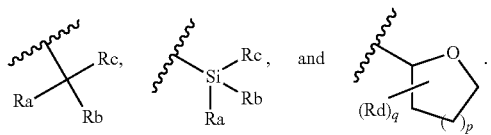

In this regard, $R_a$, $R_b$, $R_c$ and $R_d$ may be each independently selected from the group consisting of a C1-C20 alkyl group, a C3-C30 cycloalkyl group, a (C1-C10 alkyl)cycloalkyl group, a hydroxyalkyl group, a C1-C20 alkoxy group, a (C1-C10 alkoxy)alkyl group, an acetyl group, an acetylalkyl group, a carboxyl group, a (C1-C10 alkyl)carboxyl group, a (C3-C18 cycloalkyl)carboxyl group, and a C3-C30 heterocycloalkyl group or fused together between adjacent groups to form a C3-C30 saturated or unsaturated hydrocarbon ring or a C2-C20 heterocyclic group, p may be an integer of 0 to 3, and q may be an integer of 0 to 10.

$R_4$ may be selected from the group consisting of a hydrophobic group, and a C1-C20 alkyl group, a C3-C30 cycloalkyl group, an acyl group, a carboxyl group, a (C1-C20 alkyl)carboxyl group, a (C3-C30 cycloalkyl)carboxyl group, a C1-C20 heteroalkyl group, and a C2-C30 heterocycloalkyl group including the hydrophobic group.

$R_5$ may be an acid labile group selected from the group consisting of

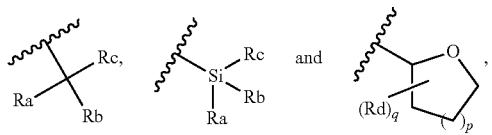

wherein $R_a$, $R_b$, $R_c$ and $R_d$ are defined as described above, or selected from the group consisting of a C1-C20 alkyl group, a C3-C30 cycloalkyl group, an acyl group, a carboxyl group, a (C1-C20 alkyl)carboxyl group, a (C3-C30 cycloalkyl)carboxyl group, a (C1-C20 alkyl)carboxylalkyl group, a C1-C20 heteroalkyl group, and a C2-C30 heterocycloalkyl group including the acid labile group.

Here, l, m, n, and o are respectively numbers of the repeat units in a backbone, wherein l+m+n+o=1, 0<l/(l+m+n+o)<0.9, 0<m/(l+m+n+o)≤0.2, 0<n/(l+m+n+o)<0.9, and 0≤o/(l+m+n+o)<0.9.

The hydrophobic group may be selected from the group consisting of a halogen atom and a C1-C20 haloalkyl group, preferably selected from the group consisting of a fluoro group and a C1-C10 fluoroalkyl group.

In Formula 1, R', R" and R'" may be each independently selected from the group consisting of a hydrogen atom, a methyl group, a fluoro group, and a trifluoromethyl group, preferably a hydrogen atom.

In Formula 1, $R_1$ and $R_2$ may be each independently a hydrogen atom or a C1-C4 alkyl group, preferably a hydrogen atom or a methyl group.

In Formula 1, $R_3$ may be a hydrogen atom or a functional group represented by Formula 2. If $R_3$ is a functional group represented by Formula 2, $R_{31}$ may be selected from the group consisting of a C1-C10 alkyl group, a (C1-C10 alkoxy)alkyl group, a C3-C14 monocyclic cycloalkyl group, a C8-C18 dicyclic cycloalkyl group, a C10-C30 tricyclic cycloalkyl group, a C10-C30 tetracyclic cycloalkyl group, a formyl group, a (C1-C10 alkyl)carbonyl group, a (C3-C18 cycloalkyl)carbonyl group, a (C1-C10 alkyl)carboxyl group, and a (C3-C18 cycloalkyl)carboxyl group, preferably selected from the group consisting of a formyl group, an acetyl group, a methoxymethyl group, a t-butylcarbonyl group, a t-butyloxycarbonyl group, a cyclohexylcarbonyl group, a cyclopentylcarbonyl group, a cyclooctylcarbonyl group, an adamantylcarbonyl group, and a bicyclo[2,2,1]heptylmethyl carbonyl group in Formula 2.

In Formula 2, $R_{32}$ may be selected from the group consisting of a C1-C10 alkanediyl group, a C2-C10 alkenediyl group, a C1-C10 heteroalkanediyl group, a C2-C10 heteroalkenediyl group, a C3-C18 cycloalkanediyl group, a C3-C18 cycloalkenediyl group, a C2-C18 heterocycloalkanediyl group, and a C3-C18 heterocycloalkanediyl group, preferably selected from the group consisting of methylene, ethylidene, propylidene, trimethylene, tetramethylene, pentamethylene, hexamethylene, heptamethylene, 2,2-dimethylpentamethylene, —OCH$_2$—, —OCH(Cl)—, —CO—, —COCH$_2$—, —COCH$_2$CH$_2$—, —CH$_2$—O—CH$_2$—, —CH$_2$O—CH$_2$CH$_2$—, —CH$_2$CH$_2$—O—CH$_2$—, CH$_2$—O—CH$_2$CH$_2$CH$_2$—, —CH$_2$CH$_2$—O—CH$_2$CH$_2$—, —CH$_2$CH$_2$CH$_2$—O—CH$_2$—, —C(CH$_3$)$_2$CH$_2$—, —CH(CH$_3$)CH$_2$—, —CH(CH$_2$CH$_3$)—, —CH(OCH$_3$)—, —C(CF$_3$)(OCH$_3$)—, —CH$_2$—S—CH$_2$—, —CH$_2$—S—CH$_2$CH$_2$—, —CH$_2$CH$_2$—S—CH$_2$—, —CH$_2$—S—CH$_2$CH$_2$CH$_2$—, —CH$_2$CH$_2$—S—CH$_2$CH$_2$—, —CH$_2$CH$_2$CH$_2$—S—CH$_2$—, —CH(CH$_2$)CH—, —C(CH$_2$CH$_2$)—, —CH$_2$CO—, —CH$_2$CH$_2$CO—, —CH(CH$_3$)CH$_2$CO—, —CH(OH)—, —C(OH)(CH$_3$)—, —CH(F)—, —CH(Br)—, —CH(Br)CH(Br)—, —CH=CH—, —CH$_2$CH=CH—, —CH=CHCH$_2$—, —CH=CHCO—, —C$_7$H$_9$—, and —C$_{10}$H$_{24}$—.

In Formula 2, $R_{33}$ may be selected from the group consisting of

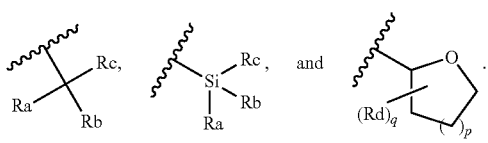

Here, $R_a$, $R_b$, $R_c$, and $R_d$ may be each independently selected from the group consisting of a C1-C10 alkyl group, a C3-C14 monocyclic cycloalkyl group, a C8-C20 dicyclic cycloalkyl group, a C10-C30 tricyclic cycloalkyl group, a C10-C30 tetracyclic cycloalkyl group, a (C1-C5 alkyl)cycloalkyl group, a hydroxyalkyl group, a C1-C10 alkoxy group, a (C1-C5 alkoxy)alkyl group, an acetyl group, an acetylalkyl group, a carboxyl group, a (C1-C5 alkyl)carboxyl group, and a (C3-C10 cycloalkyl)carboxyl group or fused together between adjacent groups to form a C6-C18 saturated or unsaturated hydrocarbon ring or a C5-C18 heterocyclic group, p may be an integer of 0 to 3, and q may be an integer of 0 to 5.

More preferably, $R_{33}$ may be selected from the group consisting of a t-butyl group, a trimethylsilyl group, a hydroxy-2-ethyl group, a 1-methoxypropyl group, a 1-methoxy-1-methylethyl group, a 1-ethoxypropyl group, a 1-ethoxy-1-methylethyl group, a 1-methoxy-1-ethyl group, a 1-ethoxy-1-ethyl group, a t-butoxy-2-ethyl group, a 1-isobutoxy-1-ethyl group, and groups represented by Formulae 3a to 3k below.

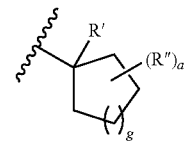
(3a)

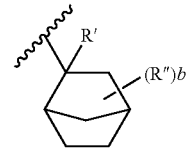
(3b)

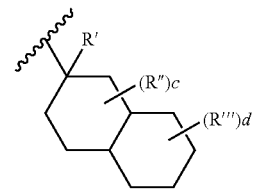
(3c)

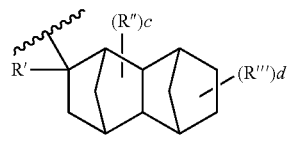
(3d)

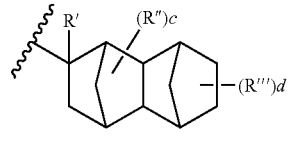
(3e)

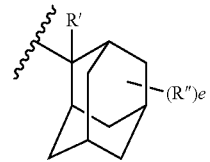
(3f)

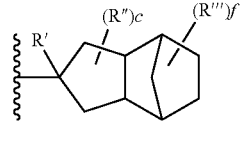
(3g)

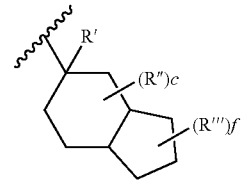
(3h)

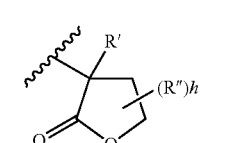
(3i)

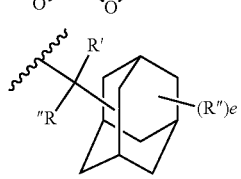

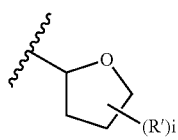
(3k)

In Formulae 3a to 3k, R', R" and R'" may be each independently a hydrogen atom or a C1-C10 alkyl group, a and e may be an integer of 0 to 15, b may be an integer of 0 to 11, c and d may be each independently an integer of 0 to 9, f may be an integer of 0 to 7, g and i may be each independently an integer of 0 to 6, h may be an integer of 0 to 4, $0 \leq c+d \leq 17$, and $0 \leq c+f \leq 15$.

More preferably, $R_{33}$ may be selected from the group consisting of Formula 4a to 4h below.

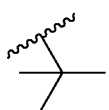
(4a)

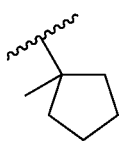
(4b)

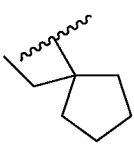
(4c)

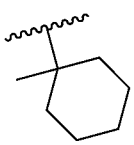
(4d)

(4e)

(4f)

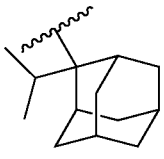
(4g)

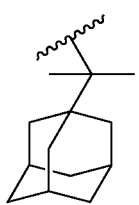
(4h)

In Formula 1, $R_4$ may be selected from the group consisting of: a C1-C20 fluoroalkyl group; and a C1-C20 alkyl group, a C3-C14 monocyclic cycloalkyl group, a C8-C18 dicyclic cycloalkyl group, a C10-C30 tricyclic cycloalkyl group, a C10-C30 tetracyclic cycloalkyl group, a (C1-C10 alkyl)carbonyl group, a (C3-C30 cycloalkyl)carbonyl group, a (C1-C10 alkyl)carboxyl group, a (C1-C20 alkoxy)alkyl group, and a (C3-C30 cycloalkyl)oxyalkyl group including at least one functional group selected from the group consisting of a fluoro group and a fluoroalkyl group. More preferably $R_4$ may be selected from the group consisting of a trifluoromethyl group, a di(trifluoromethyl)isopropyl group, a pentafluoroethyl group, and a heptafluoropropyl group.

In Formula 1, $R_5$ may be selected from the group consisting of

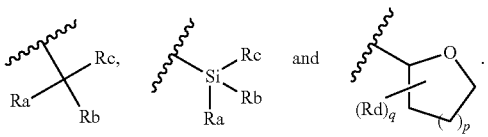 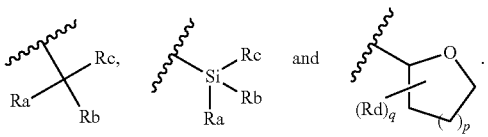 and 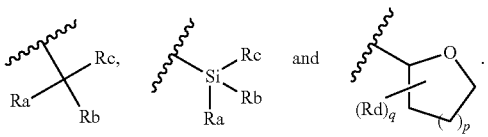.

Here, $R_a$, $R_b$, $R_c$, and $R_d$ may be each independently selected from the group consisting of a C1-C10 alkyl group, a C3-C14 monocyclic cycloalkyl group, a C8-C20 dicyclic cycloalkyl group, a C10-C30 tricyclic cycloalkyl group, a C10-C30 tetracyclic cycloalkyl group, a (C1-C5 alkyl)cycloalkyl group, a hydroxyalkyl group, a C1-C10 alkoxy group, a (C1-C5 alkoxy)alkyl group, an acetyl group, an acetylalkyl group, a carboxyl group, a (C1-C5 alkyl)carboxyl group, and a (C3-C10 cycloalkyl)carboxyl group or fused together between adjacent groups to form a C6-C18 saturated or unsaturated hydrocarbon ring or a C5-C18 heterocyclic group, p may be an integer of 0 to 3, and q may be an integer of 0 to 5

Preferably, $R_5$ may be selected from the group consisting of a t-butyl group, a trimethylsilyl group, a hydroxy-2-ethyl group, a 1-methoxypropyl group, a 1-methoxy-1-methylethyl group, a 1-ethoxypropyl group, a 1-ethoxy-1-methylethyl group, a 1-methoxy-1-ethyl group, a 1-ethoxy-1-ethyl group, a t-butoxy-2-ethyl group, a 1-isobutoxy-1-ethyl group, and groups represented by Formulae 3a to 3k below. More preferably, $R_5$ may be selected from the group consisting of Formulae 4a to 4h below.

When a resist film is formed by adding the resist additive according to the present invention having the above-mentioned structure to a resist composition, the resist additive is disposed on the surface of the resist film due to specific gravity difference and improves hydrophobicity of the surface of the resist film. As a result, the same effect as a separate protective film formed on the resist film may be obtained, and thus leaching in water may be prevented in a liquid immersion lithography process. In addition, an acid labile group contained at one end of the copolymer of the additive is converted from a hydrophobic group to a hydrophilic group via acid-induced deprotection reaction at exposed regions of the resist film. As a result, the additive is easily washed by a developer during development, and the hydrophobicity of the surface of the resist film is converted into hydrophilicity by the developer at non-exposed regions during development.

Particularly, cyclic structures of a maleic anhydride and a norbornene derivative contained in the backbone of the copolymer provide excellent etching resistance to the resist additive according to the present invention. In addition, a norbornene-derived repeat unit 1 constituting the copolymer of the additive and having a hydroxyl protecting group improves hydrophobicity of the additive, and an acid labile group disposed at one end of the repeat unit 1 is converted from a hydrophobic group to a hydrophilic group via acid-induced deprotection reaction at the exposed regions to allow the additive to be easily washed by the developer.

In addition, the maleic anhydride-derived repeat unit m does not play any role at the exposed regions but is ring-opened by the developer at the non-exposed regions to form carboxyl groups. Thus, hydrophilicity of the surface of the resist film is improved. Since the modified surface has the same characteristics as the developer, the development process is facilitated. Thus, defects caused in hydrophobic surfaces may be reduced.

In addition, an acryl-derived repeat unit n has a hydrophobic group at one end thereof to provide hydrophobicity to the copolymer and is disposed on the surface of the resist film while the resist film is formed to provide hydrophobicity to the surface of the resist film. Thus, components of the resist film are prevented from being leached in water during liquid immersion lithography.

In addition, the copolymer may optionally include an acryl-derived repeat unit o with an acid labile group at one end thereof. The acryl-derived repeat unit o is converted from a hydrophobic group to a hydrophilic group via acid-induced deprotection reaction at the exposed regions to allow the additive to be easily dissolved in the developer.

Here, l, m, and n indicate not only the content of each of the repeat units contained in the backbone of the copolymer but also substitution rates that are degrees of the dissolution of the copolymer in the developer. The copolymer according to the present invention includes the repeat units l, m, n and o given l+m+n+o=1, wherein 0<l/(l+m+n+o)<0.9, 0<m/(l+m+n+o)≤0.2, 0<n/(l+m+n+o)<0.9, and 0≤o/(l+m+n+o)<0.9. When the repeat units satisfy the above conditions, the resist film may have hydrophobicity during liquid immersion lithography. Particularly, when the content of the maleic anhydride-derived repeat unit m is less than 20 mol %, the copolymer is not dissolved in the developer at the non-exposed regions. The amount of the maleic anhydride-derived repeat unit m may be preferably in the range of 1 to 20 mol %, more preferably 5 to 15 mol %.

The resist additive according to the present invention having the structure shown above may be a block copolymer, a random copolymer, or a graft copolymer.

Examples of the resist additive according to the present invention may include compounds represented by Formulae 5 to 10 below. In the structural formulae, the order of the repeat units may be modified.

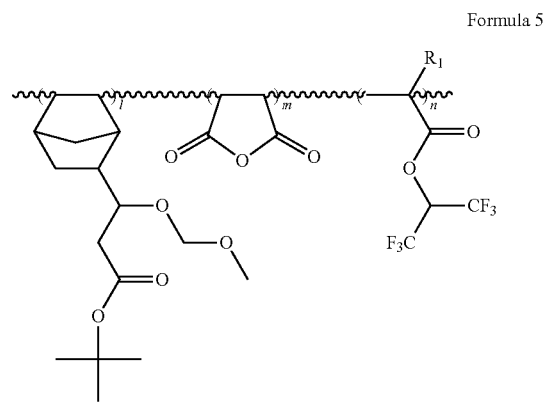

Formula 5

Formula 6

Formula 7

Formula 8

Formula 9

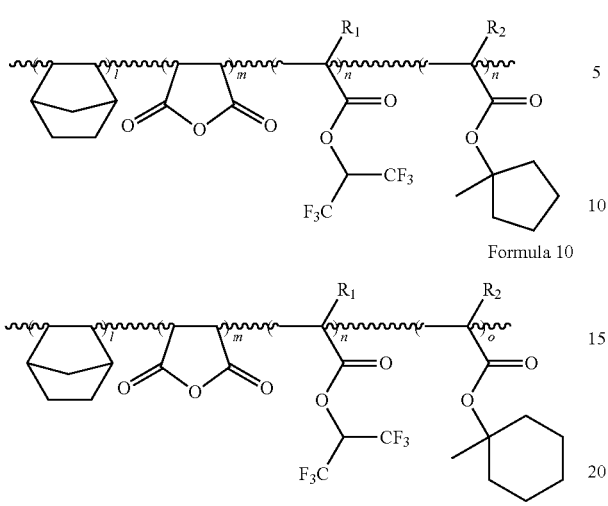

Formula 10

Formula 12

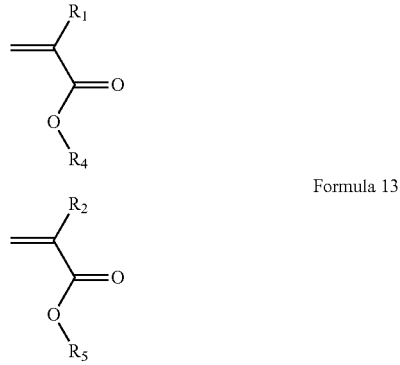

Formula 13

In Formulae 5 to 10, $R_1$ and $R_2$ may be each independently a hydrogen atom or a methyl group, and l, m, n, and o are respectively numbers of the repeat units in the backbone. Here, $l+m+n+o=1$, $0<l/(l+m+n+o)<0.9$, $0<m/(l+m+n+o)=0.20$, $0<n/(l+m+n+o)<0.9$, and $0<o/(l+m+n+o)<0.9$.

The resist additive according to the present invention may have a polystyrene equivalent weight average molecular weight (Mw) measured using gel permeation chromatography (GPC) in the range of 1,000 to 50,000 g/mol. If the Mw of the resist additive is too low, intermixing may occur or elution by pure water may occur during immersion lithography. On the other hand, if the Mw of the copolymer is too high, the film may not be appropriately formed or alkali solubility may be reduced. Preferably, the Mw of the additive may be in the range of 3,000 to 10,000 g/mol to have excellent solubility in the developer without being eluted in pure water.

In addition, the resist additive may have a molecular weight distribution, which is a weight average molecular weight/number average molecular weight (Mw/Mn) ratio, in the range of 1 to 5, more preferably 1 to 2. If the molecular weight distribution is greater than 5, line edge roughness characteristics may be deteriorated. Thus, a resist additive having Mw and molecular weight distribution within the ranges described above is used as a photoresist composition providing excellent developing properties, coating properties, and thermal resistance.

The resist additive according to the present invention having the above-mentioned structure may be prepared using a norbornene derivative represented by Formula 11 below, a maleic anhydride monomer, an acryl monomer represented by Formula 12 below, and optionally an acryl monomer represented by Formula 13 below by known polymerization, such as bulk polymerization, solution polymerization, suspension polymerization, bulk and suspension polymerization, and emulsion polymerization.

Formula 11

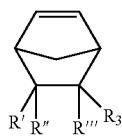

In Formulae 11 to 13, R', R", R'", and $R_1$ to $R_5$ are defined as described above.

Preferably, the resist additive according to the present invention may be polymerized by radical polymerization. In this regard, any radical polymerization initiator commonly used in the art, such as azobisisobutyronitrile (AIBN), benzoyl peroxide (BPO), lauryl peroxide, azobisisocapronitrile, azobisisovaleronitrile, and t-butyl hydroperoxide may be used without being limited thereto.

In addition, a polymerization solvent including at least one compound selected from the group consisting of benzene, toluene, xylene, halogenated benzene, diethyl ether, tetrahydrofuran, esters, ethers, lactones, ketones, amides, and alcohols may be used.

During polymerization, polymerization temperature may be appropriately selected depending on the type of catalyst employed. In addition, the molecular weight distribution of the prepared polymer may be adjusted by modifying the amount of the polymerization initiator and reaction time. After polymerization is completed, unreacted monomers and byproducts remaining in the reaction mixture may be removed by solvent precipitation.

The resist additive according to the present invention prepared by adjusting the type and amount of monomers according to the preparation method described above has suitable hydrophobicity. Thus, when the additive is added to a resist composition, the resist film formed therefrom is transparent to exposure light and immiscible with a liquid for exposure during liquid immersion lithography, and various defects that may be caused during exposure may be reduced.

According to another embodiment of the present invention, a resist composition including the resist additive is provided.

Particularly, the resist composition includes a resist base polymer, an acid generator, and a solvent in addition to the resist additive.

The resist additive is the same as that described above and may be contained in the resist composition in an amount ranging from 0.05 to 5% by weight based on the total weight of the resist composition. When the amount of the resist additive is within the range described above, a resist pattern with appropriate hydrophobicity, high resolution, and high sensitivity may be formed.

The resist base polymer may be any polymer used as a base resin in the formation of the resist film without limitation. Examples of the resist base polymer may include (meth)acrylic acidester polymers, α-trifluoromethyl)acrylic acid ester-maleic anhydride copolymer, cycloolefin-maleic anhydride copolymers, polynorbornene, cycloolefin ring-opening metathesis (ROMP) polymerization polymers, hydrogenated cycloolefin ROMP polymers, copolymers of hydroxylstyrene with one selected from the group consisting of (meth)acrylic ester derivatives, styrene, vinyl naphthalene, vinyl anthracene, vinyl pyrene, hydroxyvinyl naphthalene, hydroxyvinyl anthracene, indene, hydroxylindene, acenaphthylene, and norbornadiene, novolac resins, and mixtures thereof.

The base polymer may be contained in the resist composition in an amount in the range of 3 to 20% by weight. If the amount of the base polymer is less than 3% by weight, a film with a desired thickness may not be formed due to too low viscosity of the composition and a pattern loss is increased due to a relatively large amount of photoacid generator. On the other hand, if the amount of the base polymer is greater than 20% by weight, the film is too thick, so that transmittance to radiation is decreased and a vertical pattern may not be obtained.

The acid generator, as a photoacid generator (PAG), may include onium salts such as iodonium salts, sulfonium salts, phosphonium salts, diazonium salts, pyridinium salts, or imides, preferably at least one of the sulonium salts represented by Formulae 14 and 15, and more preferably, triphenylsulfonium nonaflate.

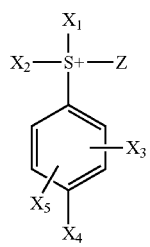

Formula 14

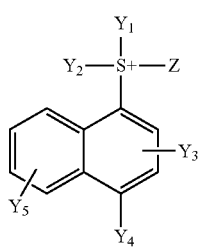

Formula 15

In Formulae 14 and 15, $X_1$, $X_2$, $Y_1$ and $Y_2$ may be each independently selected from the group consisting of a hydrogen atom, a C1-C10 alkyl group, an allyl group, a C1-C10 perfluoroalkyl group, a benzyl group, a C6-C30 aryl group, and any combination thereof. $X_1$ and $X_2$, may be respectively fused to form a C3-C30 saturated or unsaturated hydrocarbon ring, and $Y_1$ and $Y_2$ may be respectively fused to form a C3-C30 saturated or unsaturated hydrocarbon ring.

$X_3$, $X_4$, $X_5$, $Y_3$, $Y_4$ and $Y_5$ may be each independently selected from the group consisting of a hydrogen atom, a C1-C30 alkyl group, a halogen group, a C1-C30 alkoxy group, a C6-C30 aryl group, a thiophenoxy group, a C1-C30 thioalkoxy group, a C1-C20 alkoxycarbonylmethoxy group, and any combination thereof.

Z, which denotes an anion, may be $OSO_2CF_3$, $OSO_2C_4F_9$, $OSO_2C_5F_{17}$, $N(CF_3)_2$, $N(C_2F_5)_2$, $N(C_4F_9)_2$, $C(CF_3)_3$, $C(C_2F_5)_3$, $C(C_4F_9)_3$, or a functional group represented by Formula 16 below.

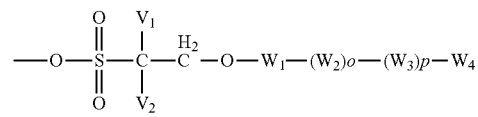

Formula 16

In Formula 16, $V_1$ and $V_2$ may be each independently a halogen atom.

$W_1$ may be —(C=O)— or —(SO_2)—.

$W_2$ may be a C1-C10 alkanediyl group.

$W_3$ may be selected from the group consisting of a C3-C30 cycloalkyl group, a C6-C30 aryl group, a C7-C30 aralkyl group, a C6-C30 aryloxy group, a C6-C30 arylthio group, and a C5-C30 heterocyclic group.

$W_4$ may be selected from the group consisting of a hydrogen atom, a halogen group, a C1-C10 alkyl group, a C1-C10 alkoxy group, a C1-C10 haloalkyl group, a C1-C10 alkylthio group, a C6-C30 aryl group, and any combination thereof.

Here, o may be an integer of 0 to 1.

Here, p may be an integer of 0 to 2.

In the acid generator, a diffusion length of acid in a resist film may be appropriately maintained short and the resist film may have high transmittance by introducing a cyclic alkyl group to the anions. As a result, a resist with high resolution may be obtained.

Preferably, Z, which denotes an anion, in Formula 16 may be selected from the group consisting of functional groups represented by Formulae 17a to 17l and 18a to 18x below.

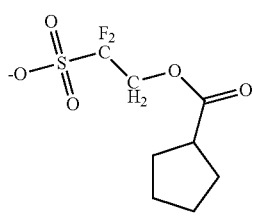

(17a)

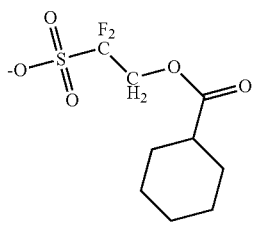

(17b)

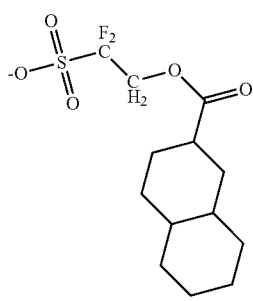

(17c)

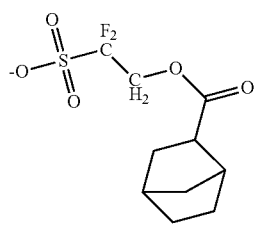 (17d)
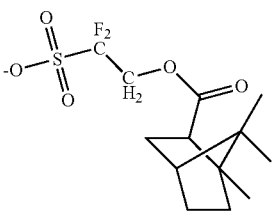 (17e)
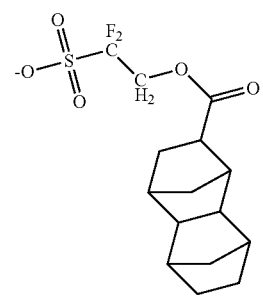 (17f)
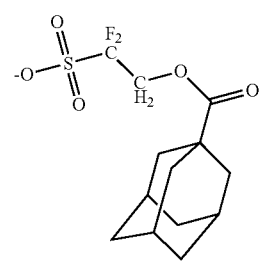 (17g)
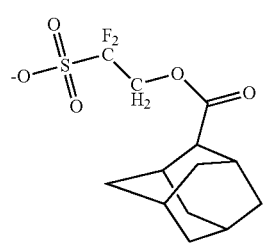 (17h)
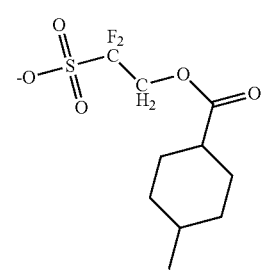 (17i)
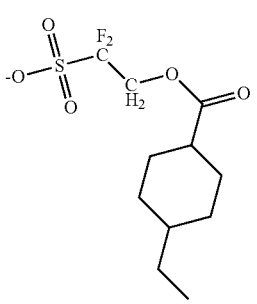 (17j)
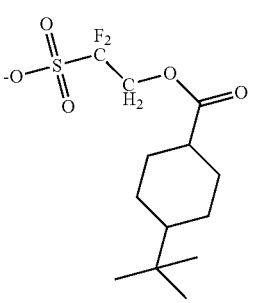 (17k)
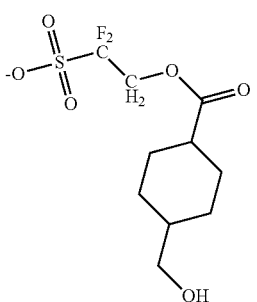 (17l)
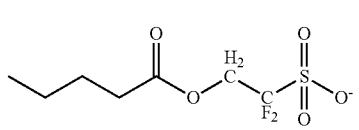 (18a)
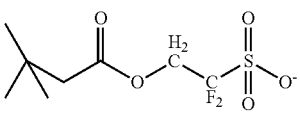 (18b)
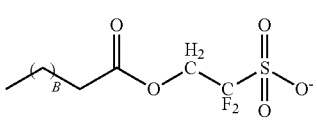 (18c)
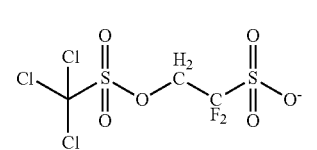 (18d)
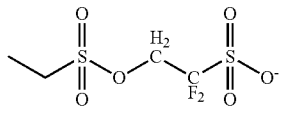 (18e)

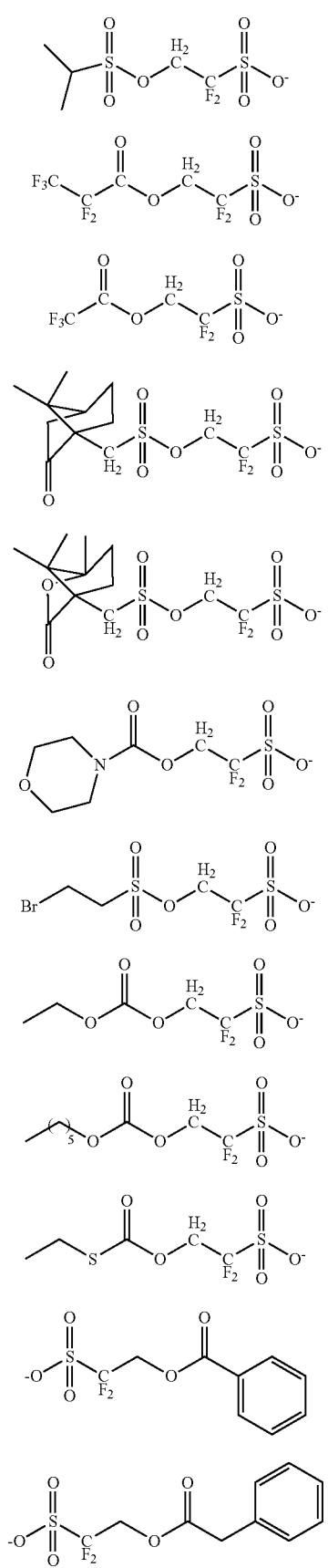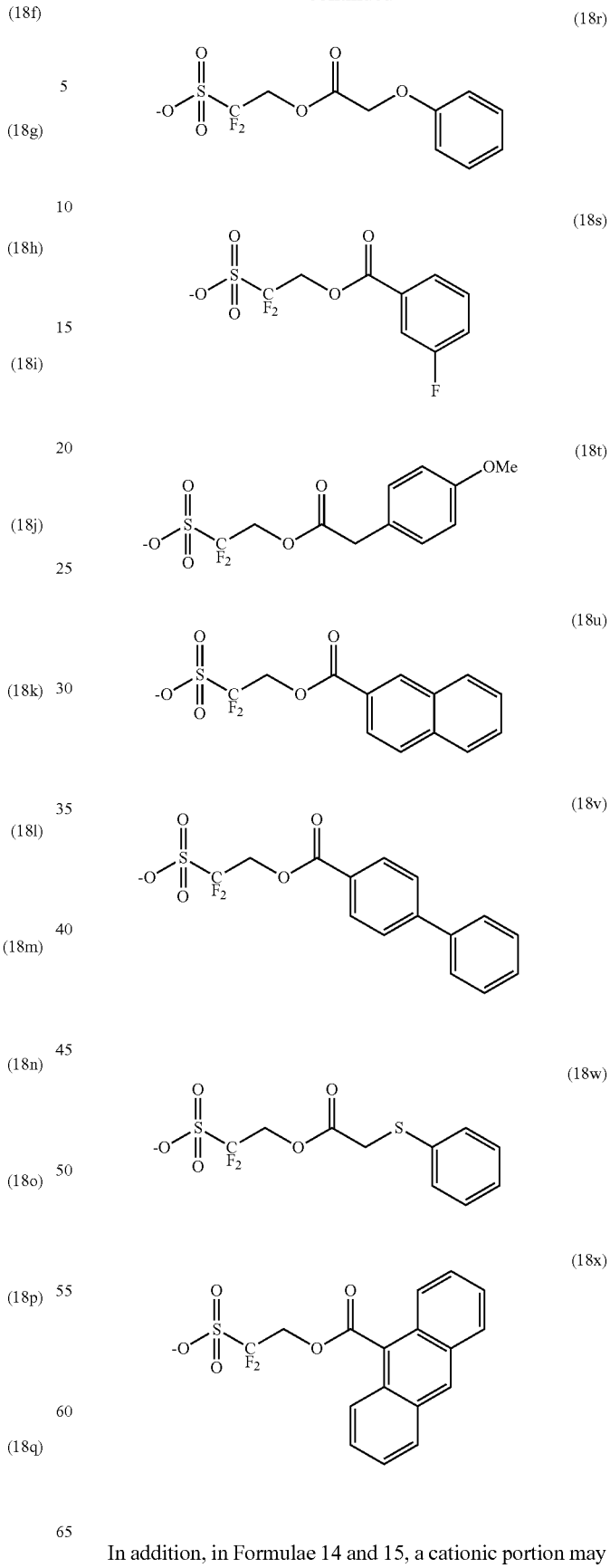
In addition, in Formulae 14 and 15, a cationic portion may be represented by Formulae 19a to 19p below.

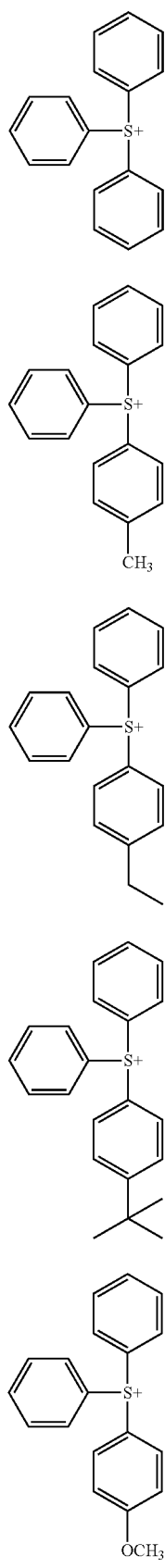
(19a)
(19b)
(19c)
(19d)
(19e)
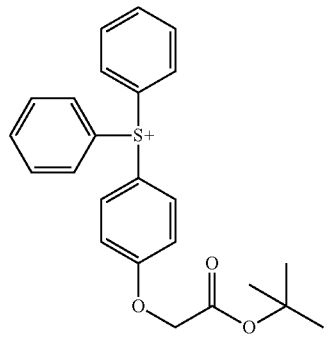
(19f)
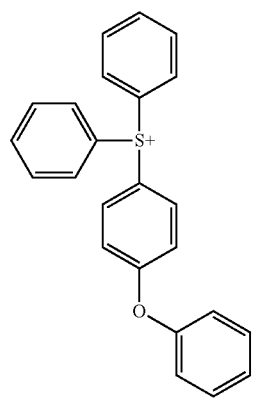
(19g)
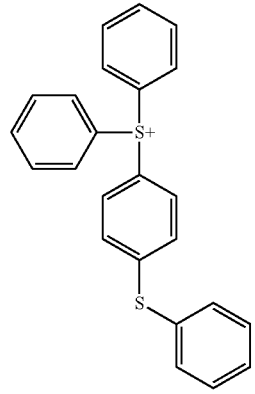
(19h)
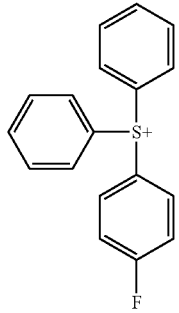
(19i)

(19j) 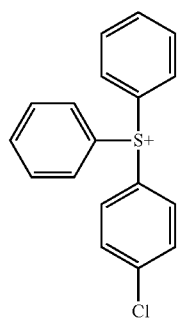

(19k) 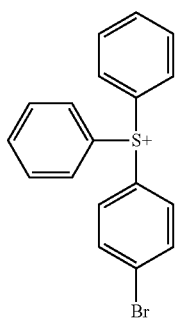

(19l) 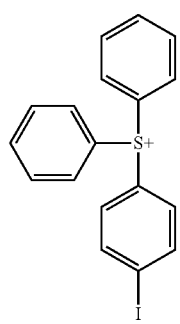

(19m) 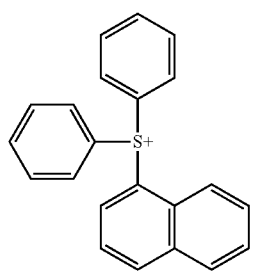

(19n) 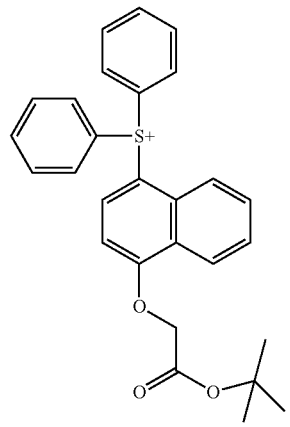

(19o) 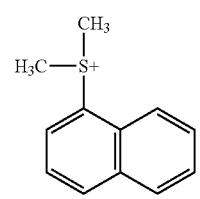

(19p) 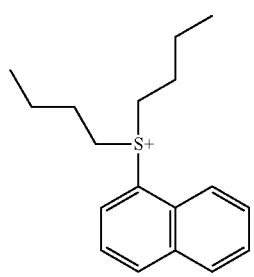

The acid generators may be used alone or in combination of at least two thereof. In addition, the amount of the acid generator may be in the range of 0.3 to 15 parts by weight, preferably 0.5 to 10 parts by weight, more preferably 2 to 10 parts by weight based on 100 parts by weight of polymer solids. If the amount of the acid generator is greater than 15 parts by weight, verticality of a pattern may significantly decrease. On the other hand, if the amount of the acid generator is less than 0.3 parts by weight, flexibility of a pattern may be deteriorated.

In order to uniformly and smoothly coat the resist composition, the polymer and the acid generator may be dissolved in a solvent having an appropriate evaporation rate and viscosity. Examples of the solvent may include: esters such as ethylene glycol monomethyl ether, ethylene glycol monoethyl ether, ethylene glycol monopropyl ether, methylcellosolve acetate, ethylcellosolve acetate, propylene glycol monomethyl ether acetate, propylene glycol monoethyl ether acetate, and propylene glycol monopropyl ether acetate; and ketones such as methyl isopropyl ketone, cyclohexanone, methyl 2-hydroxypropionate, ethyl 2-hydroxypropionate, 2-heptanone, ethyl lactate, and γ-butyrolactone. These solvents may be used alone or in combination of at least two thereof.

The amount of the solvent may be appropriately adjusted according to physical properties of the solvent, i.e., volatility, viscosity, and the like.

The resist composition according to the present invention may also include additives depending on application such as improvement of coating properties.

The additive may be any additive commonly used in resist compositions without limitation. Examples of the additive may include an alkali soluble quencher, an acid diffusion quencher, and a surfactant, and the additives may be used alone or in combination of at least two thereof.

The alkali soluble quencher may be any alkali soluble quencher commonly used in resist compositions. Examples of the alkali soluble quencher may include phenol or carboxylic acid derivatives.

The acid diffusion quencher suppresses diffusion of acid generated by the acid generator during exposure to the resist film and chemical reaction in non-exposed regions. Through use of the acid diffusion quencher, storage stability of radiosensitive resin compositions may be improved, resolution of the resist may be improved, and line width variation of the resist pattern during a period from exposure to development may be inhibited.

The acid diffusion quencher may be a basic compound. Examples of the acid diffusion quencher may include: amines such as ammonia, methylamine, isopropylamine, n-hexylamine, cyclopentylamine, methylenediamine, ethylenediamine, dimethylamine, diisopropylamine, diethylenediamine, N,N-dimethylmethylenediamine, N,N-dimethylethylenediamine, trimethylamine, triethylamine, N,N,N',N'-tetramethylmethylenediamine, N,N,N',N'-tetramethylethylenediamine, N,N,N',N'-tetramethyltetraethylenepentamine, dimethylethylamine, methylethylpropylamine, benzylamine, phenethylamine, benzyldimethylamine, tetramethyl ammonium hydroxide, aniline, N,N-dimethyltoluidine, triphenylamine, phenylenediamine, pyrrole, oxazole, isooxazole, thiazole, isothiazole, imidazole, pyrazole, pyrroline, pyrrolidine, imidazoline derivatives, imidazolidine derivatives, pyridine derivatives, pyridazine derivatives, pyrimidine derivatives, pyrazine derivatives, pyrazoline derivatives, pyrazolidine derivatives, pyperidine derivatives, piperazine derivatives, and morpholine; nitrogen-containing compounds such as aminobenzoic acid, indolecarboxylic acid, amino acid derivatives (e.g., nicotinic acid, alanine, arginine, and aspartic acid), 3-pyridinesulfonic acid, p-pyridiunium toluenesulfonate, 2-hydroxypyridine, amino cresol, 2,4-quinolinediol, 2-(2-hydroxyethyl)pyridine, and 1-(2-hydroxyethyl)piperazine; amide derivatives such as formamide, N-methylformamide, N,N-dimethylformamide, acetamide, N-methylacetamide, N,N-dimethylacetamide, propionic amide, and benzamide; or imide derivatives such as phthalimide, succinimide, and maleimide.

The amount of the basic compound may be in the range of 0.01 to 5 parts by weight, preferably, 0.1 to 1 parts by weight, based on 100 parts by weight of polymer solids. If the amount of the basic compound is less than 0.01 parts by weight, the pattern may be deformed as a delay time after exposure increases. On the other hand, if the amount of the basic compound is greater than 5 parts by weight, resolution and sensitivity may be deteriorated.

The surfactant is used to improve coating properties, developing properties, and the like. Examples of the surfactant may include polyoxyethylenelaurylether, polyoxyethylenestearylether, polyoxyethylene, and polyethyleneglycoldilaurate, but are not limited thereto.

A resist pattern that is formed using the resist composition according to the present invention has improved line width roughness characteristics and high resolution in both C/H and L/S patterns. In addition, a wide process window provides an excellent pattern profile regardless of the type of the substrate and improved contrast. Accordingly, the resist composition is useful as a positive chemically amplified photoresist composition having photosensitivity to far ultraviolet light such as is produced by a KrF excimer laser, ArF excimer laser, or $F_2$ excimer laser, X-rays such as synchrotron radiation, and charged particle rays such as extreme ultraviolet (EUV).

According to another embodiment of the present invention, a method of forming a resist pattern using the resist composition is provided.

Particularly, the method includes forming a resist film by coating the resist composition on a substrate, heating the resist film and exposing the resist film to light to form a predetermined pattern, and developing the exposed pattern.

The substrate may be a wafer substrate, and the coating may be performed on the substrate via spin coating, flown coating, roll coating, or the like.

Particularly, the resist composition is coated on the substrate such as a silicon wafer to a thickness in the range of 0.3 to 2.0 μM, and the coating is pre-baked at 60 to 150☐ for 1 to 10 minutes, preferably at 80 to 130☐ for 1 to 5 minutes.

Then, the resist film is partially exposed to radiation in order to form a micropattern. In this regard, examples of the radiation may include ultraviolet light such as I-line, far ultraviolet light such as is produced by a KrF excimer laser, ArF excimer laser, and $F_2$ excimer laser, X-rays, and charged particle rays such as electron beams, but are not limited thereto. The radiation may be appropriately adjusted according to the type of the acid generator.

Particularly, exposure is performed in an exposure dose of about 1 to about 200 $mJ/m^2$, preferably about 10 to about 100 $mJ/m^2$. This is followed by post exposure baking (PEB) at 60 to 150☐ for 1 to 5 minutes, preferably at 80 to 130☐ for 1 to 3 minutes.

After exposure, the exposed resist pattern is developed with a developer for 0.1 to 3 minutes, preferably 0.5 to 2 minutes by any conventional techniques such as dip, puddle, and spray techniques. As a result, a desired pattern is formed on the substrate. The developer may be an aqueous solution including sodium hydroxide, potassium hydroxide, sodium carbonate, sodium silicate, sodium methasilicate, ammonia, ethylamine, n-propylamine, triethylamine, tetramethylammonium hydroxide, tetraethylammonium hydroxide, or the like, preferably tetramethylammonium hydroxide.

Optionally, the developer may further include additives such as a surfactant or water soluble alcohols.

According to the method of forming the pattern using the resist composition according to the present invention, a micro resist pattern with excellent sensitivity and high resolution may be obtained.

Hereinafter, the present invention will be described more fully with reference to the following examples. However, the following examples are capable of being embodied through modifications and alternative forms, and there is no intent to limit the embodiments to the particular forms disclosed herein.

Preparation Example

Synthesis of Monomer and Polymer Monomer Synthesis Example 1

Synthesis of 3-bicyclo[2.2.1]hept-5-en-2-yl-3-methoxymethoxy-propionic acid tert-butyl ester

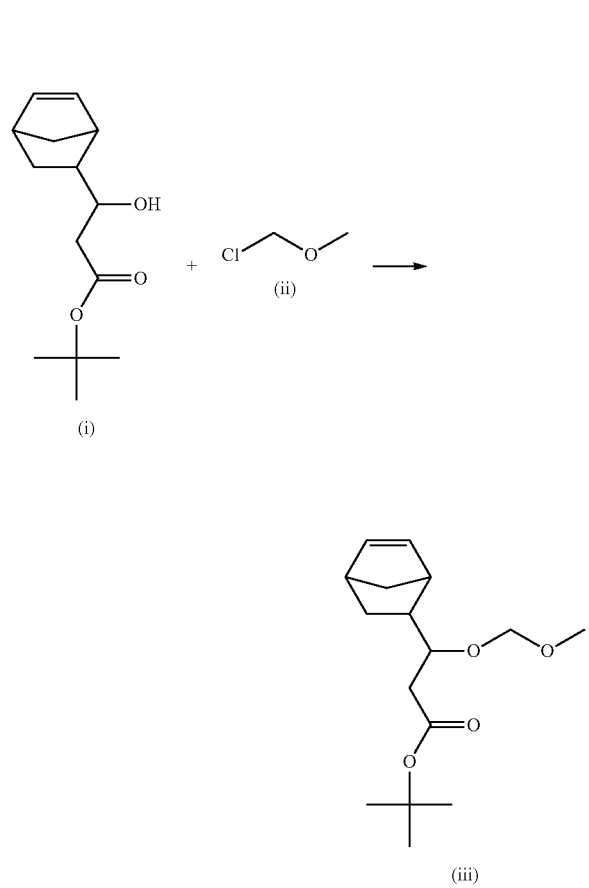

66 g of diisopropyl ethyl amine was dropped to a solution prepared by dissolving 100 g of 3-bicyclo[2.2.1]hept-5-en-2-yl-3-hydroxy-propionic acid tert-butyl ester (BHP) i and 44 g of chloromethyl methyl ether ii in 1 L of methylene chloride while stirring at room temperature. The mixture was stirred at room temperature for 4 hours, and reaction was evaluated by thin-layer chromatography (TLC) and terminated. This was followed by workup twice with 400 ml of each of a 1 N HCl solution and a 10% $Na_2CO_3$ solution, the resultant was washed with 400 ml of distilled water, and an organic layer was collected. Methylene chloride was removed from the organic layer at reduced pressure to obtain 96 g of 3-bicyclo[2,2,1]hept-5-en-2-yl-3-methoxymethoxy-propionic acid t-butyl ester iii (Yield: 81%). The structure was identified using $^1$H NMR.

$^1$H NMR (CDCl$_3$, internal standard: tetramethyl silane): (ppm) 0.50~2.00 (m, 14H), 2.20~2.60 (m, 3H), 2.81 (s, 1H), 3.28~3.48 (m, 3.8H), 3.70~3.93 (m, 0.2H), 4.55~4.82 (m, 2H), 5.84~6.24 (m, 2H)

Monomer Synthesis Example 2

Synthesis of 3-bicyclo[2.2.1]hept-5-en-2-yl-3-tert-butoxycarbonyloxy-propionic acid tert-butyl ester

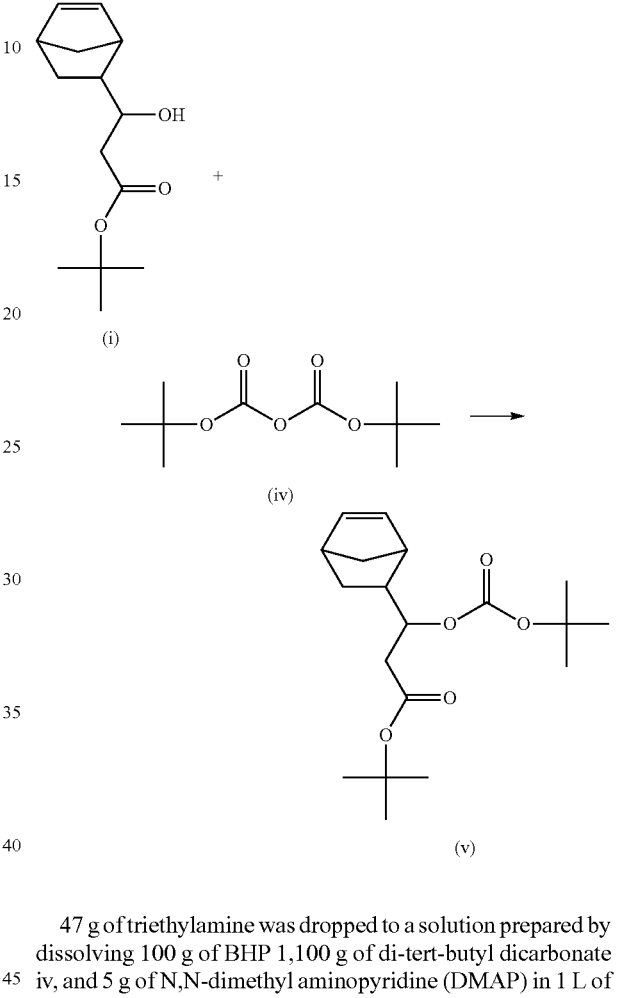

47 g of triethylamine was dropped to a solution prepared by dissolving 100 g of BHP 1,100 g of di-tert-butyl dicarbonate iv, and 5 g of N,N-dimethyl aminopyridine (DMAP) in 1 L of methylene chloride while stirring at room temperature. The mixture was stirred at room temperature for 4 hours, and reaction was evaluated by TLC and terminated. This was followed by workup twice with 400 ml of each of a 1 N HCl solution and a 10% $Na_2CO_3$ solution, the resultant was washed with 400 ml of distilled water, and an organic layer was collected. Methylene chloride was removed from the organic layer at reduced pressure to obtain 109 g of 3-bicyclo[2.2.1]hept-5-en-2-yl-3-tert-butoxycarbonyloxy-propionic acid tert-butyl ester v (Yield: 78%). The structure was identified using $^1$H NMR.

$^1$H NMR (CDCl$_3$, internal standard: tetramethyl silane): (ppm) 0.50~2.00 (m, 22H), 2.20~2.73 (m, 3H), 2.83 (s, 2H), 4.5 (m, 0.7H), 4.87~5.19 (m, 0.3H), 5.84~6.24 (m, 2H)

Polymer Synthesis Example 1

7.2 g of 3-bicyclo[2,2,1]hept-5-en-2-yl-3-methoxymethoxy-propionic acid t-butyl ester prepared in Monomer Synthesis Example 1, as a monomer for polymerization, 0.59 g of dimethyl azobis isobutylate, as a polymerization initiator, and 5.8 g of 1,4-dioxane were added to a flask and mixed. The air in the flask is replaced with nitrogen gas, and the flask was heated until temperature in the flask reached 50° C. When the temperature in the flask was 50° C., a solution prepared by dissolving 1 g of maleic anhydride and 3.4 g of acrylic acid 2,2,2-trifluoro-1-trifluoromethyl-ethyl ester in 11.6 g of 1,4-dioxane was slowly added to the flask over 2 hours using a feeding pump while heating the flask to 75° C. Then, polymerization was further performed at the same temperature for 3 hours and terminated, and the resultant reaction solution was cooled to room temperature. The cooled reaction solution was precipitated using an excess of n-hexane, and the precipitates were filtered using the same solvent. The filtrate was dried at reduced pressure to obtain 2.64 g of Polymer vi represented by the following structural formula. A polystyrene equivalent weight average molecular weight was 5692 g/mol, and a weight average molecular weight/number average molecular weight (Mw/Mn) ratio was 1.53.

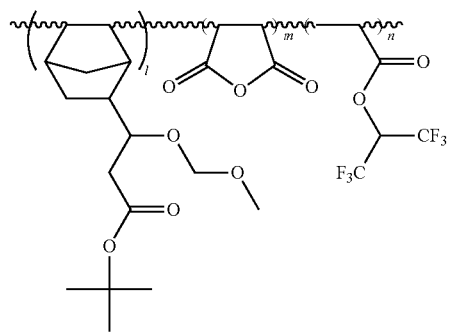

Polymer Synthesis Example 2

8.63 g of 3-bicyclo[2,2,1]hept-5-en-2-yl-t-butoxycarbonyloxy-propionic acid t-butyl ester prepared in Monomer Synthesis Example 2, as a monomer for polymerization, 0.59 g of dimethyl azobis isobutylate, as a polymerization initiator, and 6.52 g of 1,4-dioxane were added to a flask and mixed. The air in the flask is replaced with nitrogen gas, and the flask was heated until temperature in the flask reached 50° C. When the temperature in the flask was 50° C., a solution prepared by dissolving 1 g of maleic anhydride and 3.4 g of acrylic acid 2,2,2-trifluoro-1-trifluoromethyl-ethyl ester in 13.03 g of 1,4-dioxane was slowly added to the flask over 2 hours using a feeding pump while heating the flask to 75° C. Then, polymerization was further performed at the same temperature for 3 hours and terminated, and the resultant reaction solution was cooled to room temperature. The cooled reaction solution was precipitated using an excess of n-hexane, and the precipitates were filtered using the same solvent. The filtrate was dried at reduced pressure to obtain 3.13 g of Polymer vii represented by the following structural formula. A polystyrene equivalent weight average molecular weight was 21116 g/mol, and an Mw/Mn ratio was 2.98.

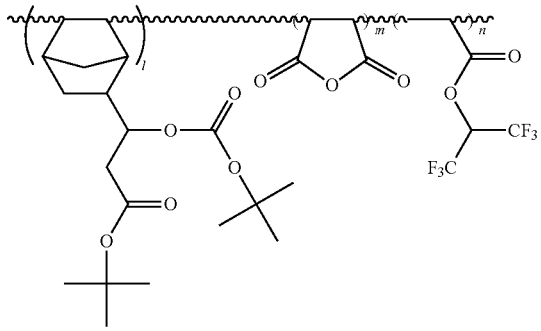

Polymer Synthesis Example 3

2.88 g of norbornene, 5.66 g of acrylic acid 2,2,2-trifluoro-1-trifluoromethyl-ethylether, and 3.93 g of acrylic acid 1-methyl-cyclopentyl ester, as monomers for polymerization, 0.59 g of dimethyl azobis isobutylate, as a polymerization initiator, and 7.24 g of 1,4-dioxane were added to a flask mixed. The air in the flask is replaced with nitrogen gas, and the flask was heated until temperature in the flask reached 50° C. When the temperature in the flask was 50° C., a solution prepared by dissolving 1 g of maleic anhydride in 14.47 g of 1,4-dioxane was slowly added to the flask over 2 hours using a feeding pump while heating the flask to 75° C. Then, polymerization was further performed at the same temperature for 3 hours and terminated, and the resultant reaction solution was cooled to room temperature. The cooled reaction solution was precipitated using an excess of n-hexane, and the precipitates were filtered using the same solvent. The filtrate was dried at reduced pressure to obtain 4.04 g of Polymer viii represented by the following structural formula. A polystyrene equivalent weight average molecular weight was 4116 g/mol, and an Mw/Mn ratio was 1.38.

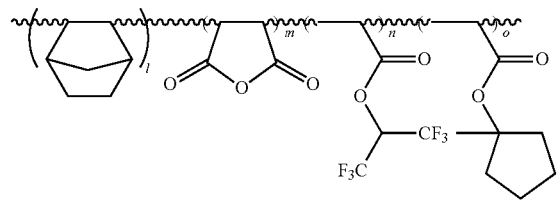

Polymer Synthesis Example 4

2.88 g of norbornene, 5.66 g of acrylic acid 2,2,2-trifluoro-1-trifluoromethyl-ethylether, and 4.09 g of acrylic acid 1-methyl-cyclohexyl ester, as monomers for polymerization, 0.59 g of dimethyl azobis isobutylate, as a polymerization initiator, and 7.24 g of 1,4-dioxane were added to a flask and mixed. The air in the flask is replaced with nitrogen gas, and the flask was heated until temperature in the flask reached 50° C. When the temperature in the flask was 50° C., a solution prepared by dissolving 1 g of maleic anhydride in 14.89 g of 1,4-dioxane was slowly added to the flask over 2 hours using a feeding pump while heating the flask to 75° C. Then, polymerization was further performed at the same temperature for 3 hours and terminated, and the resultant reaction solution was cooled to room temperature. The cooled reaction solution was precipitated using an excess of n-hexane, and the precipitates were filtered using the same solvent. The filtrate was dried at reduced pressure to obtain 3.98 g of Polymer ix represented by the following structural formula. A polystyrene equivalent weight average molecular weight was 4099 g/mol, and an Mw/Mn ratio was 1.41.

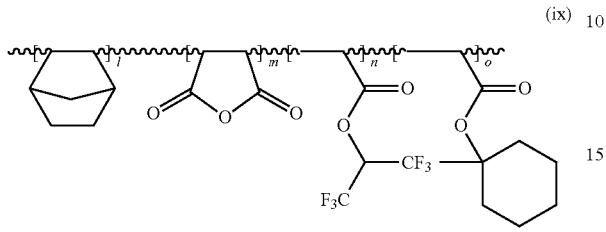

(ix)

Experimental Example

Formation of Resist Film and Measurement of Characteristics of Resist Film

Examples and Comparative Example 1.0 g of each of the polymers synthesized in Polymer Synthesis Examples 1 to 4, as an additive for a resist composition, 5 g of a resist base polymer represented by Formula 20 below (Mw: 8,500 g/mol, Mw/Mn: 1.75, and a molar ratio of repeat units: 1:1:1:1), and 0.31 g of a photoacid generator represented by Formula 21 below were dissolved in 80 g of propylene glycol monoethyl ether acetate (PGMEA), and the solution was filtered using a 0.2 μm polypropylene filter to form photoresist film compositions. For comparison with the additive according to the present invention in terms of effect, Polymer x represented by the Formula 22 was used in a comparative example.

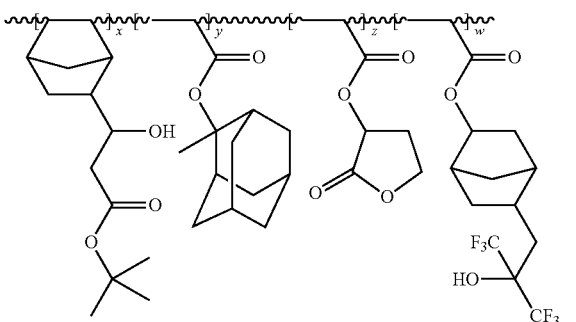

Formula 20

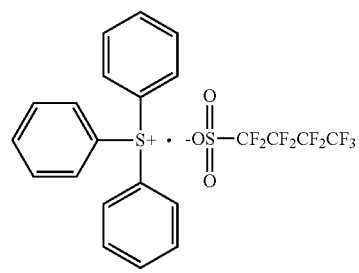

Formula 21

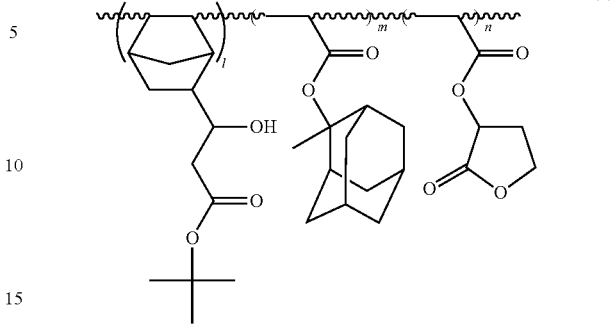

Formula 22

(x)

A bottom anti-reflective coating (BARC) with a thickness of 90 nm was formed on a silicon substrate, and a photoresist composition prepared as described above was coated on the substrate provided with the BARC. The substrate was backed at 110° C. for 60 seconds to form a photoresist film with a thickness of 120 nm.

A thickness change of each of the resist protective films before and after development was measured by developing the silicon substrate provided with the resist protective film with 2.38% by weight of a trimethylammonium hydroxide (TMAH) aqueous solution, and measuring thickness of the resist protective film.

Sliding angles and receding contact angles of the resist protective films were respectively measured.

Specifically, 50 μl of pure water was dropped to form a droplet on the silicon substrate provided with the resist protective film which was kept horizontal. While the silicon substrate was gradually inclined, the angle (sliding angle) at which the droplet started sliding down was determined as well as the receding contact angle. Results are shown in Table 1 below.

Then, in order to realize liquid immersion lithography, exposed films were rinsed with pure water for 5 minutes. That is, exposure was performed using an ArF scanner 306C (Nikon Corp., NA=0.78, 6% halftone mask) and the substrate was rinsed with pure water for 5 minutes. The exposure was performed at 110° C. for 60 seconds, a PEB was performed, and a development was performed using 2.38% by weight of TMAH developer for 60 seconds.

The silicon substrates were cut to evaluate sensitivity. The sensitivity corresponded to an exposure dose used to form a 65 nm line-and-space (L/S) pattern at a resolution of 1:1. Results are shown in Table 1 below.

TABLE 1

| Resist composition | Resist additive | Thickness of film after development (nm) | Sliding angle (°) | Receding contact angle (°) | Sensitivity (mJ/cm²) |
| --- | --- | --- | --- | --- | --- |
| Example 1 | Polymer vi | 5 | 92.4 | 74 | 45 |
| Example 2 | Polymer vii | 4 | 91.2 | 70 | 48 |
| Example 3 | Polymer viii | 3 | 90.2 | 72 | 48 |
| Example 4 | Polymer ix | 4 | 92.4 | 72 | 46 |
| Comparative Example | Polymer x | 4 | 67 | 51 | No pattern formed |

Referring to Table 1, the resist films formed using the resist compositions including the resist additives prepared in Examples 1 to 4 had higher sliding angles and higher receding contact angles than that the resist film formed using the resist composition prepared in the comparative example. In addition, the resist films prepared in Examples 1 to 4 had excellent sensitivity after liquid immersion lithography, but a pattern was not formed in the resist film formed in the comparative example.

As is apparent from the above description, the present invention provides a resist additive added to the resist composition and disposed on the surface of the resist film while the resist film is formed. The resist additive improves hydrophobicity of the surface of the resist film to prevent materials from being leached in water during exposure of immersion lithography and is converted to have hydrophilicity by deprotection reaction during development. As a result, a micropattern of a resist film with excellent sensitivity and high resolution may be formed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A resist composition comprising a resist additive represented by Formula 1 below, a resist base polymer, an acid generator, and a solvent,

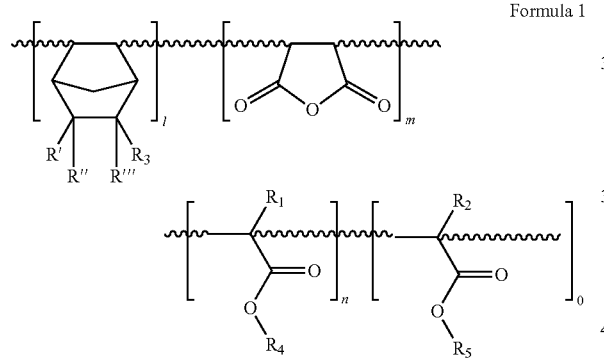

Formula 1 wherein R', R" and R'" are each independently selected from the group consisting of a hydrogen atom, a C1-C4 alkyl group, a halogen group, and a C1-C4 haloalkyl group in which one hydrogen atom is substituted with a halogen group;

$R_1$ and $R_2$ are each independently a hydrogen atom or a C1-C8 alkyl group;

$R_3$ is a hydrogen atom or a functional group represented by Formula 2 below:

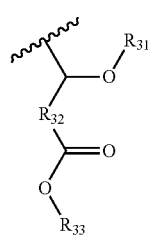

Formula 2 wherein $R_{31}$ is a hydrogen atom, or a hydroxyl protecting group selected from the group consisting of a C1-C20 alkyl group, a (C1-C20 alkoxy)alkyl group, a C3-C30 cycloalkyl group, a formyl group, a (C1-C20 alkyl)carbonyl group, a (C3-C30 cycloalkyl)carbonyl group, a (C1-C20 alkyl)carboxyl group, and a (C3-C30 cycloalkyl)carboxyl group, $R_{32}$ is selected from the group consisting of a C1-C20 alkanediyl group, a C2-C20 alkenediyl group, a C1-C20 heteroalkanediyl group, a C2-C20 heteroalkenediyl group, a C3-C30 cycloalkanediyl group, a C3-C30 cycloalkenediyl group, a C2-C30 heterocycloalkanediyl group, and a C3-C30 heterocycloalkanediyl group, and $R_{33}$ is an acid labile group selected from the group consisting of

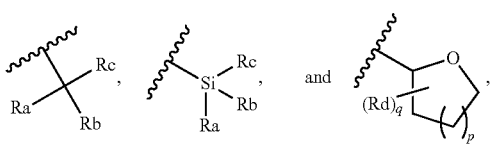

wherein $R_a$, $R_b$, $R_c$ and $R_d$ are each independently selected from the group consisting of a C1-C20 alkyl group, a C3-C30 cycloalkyl group, a (C1-C10 alkyl)cycloalkyl group, a hydroxyalkyl group, a C1-C20 alkoxy group, a (C1-C10 alkoxy)alkyl group, an acetyl group, an acetylalkyl group, a carboxyl group, a (C1-C10 alkyl)carboxyl group, a (C3-C18 cycloalkyl)carboxyl group, and a C3-C30 heterocycloalkyl group or fused together between adjacent groups to form a C3-C30 saturated or unsaturated hydrocarbon ring or a C2-C20 heterocyclic group, p is an integer of 0 to 3, and q is an integer of 0 to 10;

$R_4$ is selected from the group consisting of a hydrophobic group, and a C1-C20 alkyl group, a C3-C30 cycloalkyl group, an acyl group, a carboxyl group, a (C1-C20 alkyl)carboxyl group, a (C3-C30 cycloalkyl)carboxyl group, a C1-C20 heteroalkyl group, and a C2-C30 heterocycloalkyl group comprising the hydrophobic group, in which the hydrophobic group is selected from the group consisting of a halogen atom and a C1-C2 haloalkyl group;

$R_5$ is an acid labile group selected from the group consisting of

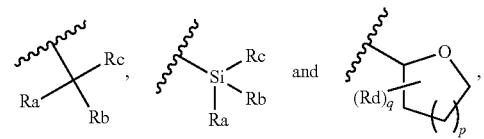

wherein $R_a$, $R_b$, $R_c$ and $R_d$ are each independently selected from the group consisting of a C1-C20 alkyl group, a C3-C30 cycloalkyl group, a (C1-C10 alkyl)cycloalkyl group, a hydroxyalkyl group, a C1-C20 alkoxy group, a (C1-C10 alkoxy)alkyl group, an acetyl group, an acetylalkyl group, a carboxyl group, a (C1-C10 alkyl)carboxyl group, a (C3-C18 cycloalkyl)carboxyl group, and a C3-C30 heterocycloalkyl group or fused together between adjacent groups to form a C3-C30 saturated or unsaturated hydrocarbon ring or a C2-C20 heterocyclic group, p is an integer of 0 to 3, and q is an integer of 0 to 10, or selected from the group consisting of a C1-C20 alkyl group, a C3-C30 cycloalkyl group, an acyl group, a carboxyl group, a (C1-C20 alkyl)carboxyl group, a (C3-C30 cycloalkyl)carboxyl group, a (C1-C20 alkyl)carboxyalkyl group, a C1-C20 heteroalkyl group, and a C2-C30 heterocycloalkyl group comprising the acid labile group; and l, m, n and o are respectively numbers of the repeat units in a backbone, wherein l+m+n+o=1, 0<l/(l+m+n+o)<0.9, 0<m/(l+m+n+o)≤0.2, 0<n/(l+m+n+o)<0.9, and 0≤o/(l+m+n+o)<0.9, wherein the amount of the resist additive is in the range of 0.05 to 5% by weight based on the total weight of the resist composition.

2. The resist composition of claim 1, wherein R₃ is represented by the formula (2) and in Formula (2), R₃₁ represents a group selected from the group consisting of a C1-C10 alkyl group, a (C1-C10 alkoxy)alkyl group, a C3-C14 monocyclic cycloalkyl group, a C8-C18 dicyclic cycloalkyl group, a C10-C30 tricyclic cycloalkyl group, a C10-C30 tetracyclic cycloalkyl group, a formyl group, a (C1-C10 alkyl)carbonyl group, a (C3-C18 cycloalkyl)carbonyl group, a (C1-C10 alkyl)carboxyl group, and a (C3-C18 cycloalkyl)carboxyl group.

3. The resist composition of claim 1, wherein R₃ is represented by the formula (2) and in Formula (2), R₃₁ represents a group selected from the group consisting of a formyl group, an acetyl group, a methoxymethyl group, a t-butylcarbonyl group, a t-butyloxycarbonyl group, a cyclohexylcarbonyl group, a cyclopentylcarbonyl group, a cyclooctylcarbonyl group, an adamantylcarbonyl group, and a bicyclo[2,2,1]heptylmethyl carbonyl group.

4. The resist composition of claim 1, wherein R₃ is represented by the formula (2) and in Formula (2), R₃₃ represents a group selected from the group consisting of

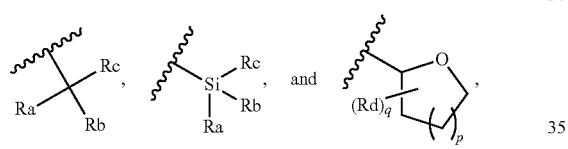

wherein Rₐ, R_b, R_c, and R_d are each independently selected from the group consisting of a C1-C10 alkyl group, a C3-C14 monocyclic cycloalkyl group, a C8-C20 dicyclic cycloalkyl group, a C10-C30 tricyclic cycloalkyl group, a C10-C30 tetracyclic cycloalkyl group, a (C1-C5 alkyl)cycloalkyl group, a hydroxyalkyl group, a C1-C10 alkoxy group, a (C1-C8 alkoxy)alkyl group, an acetyl group, an acetylalkyl group, a carboxyl group, a (C1-C8 alkyl)carboxyl group, and a (C3-C10 cycloalkyl)carboxyl group or fused together between adjacent groups to form a C6-C18 saturated or unsaturated hydrocarbon ring or a C5-C18 heterocyclic group, p is an integer of 0 to 3, and q is an integer of 0 to 5.

5. The resist composition of claim 1, wherein R₃ is represented by the formula (2) and in Formula (2), R₃₃ represents a group selected from the group consisting of a t-butyl group, a trimethylsilyl group, a hydroxy-2-ethyl group, a 1-methoxypropyl group, a 1-methoxy-1-methylethyl group, a 1-ethoxypropyl group, a 1-ethoxy-1-methylethyl group, a 1-methoxy-1-ethyl group, a 1-ethoxy-1-ethyl group, a t-butoxy-2-ethyl group, a 1-isobutoxy-1-ethyl group, and groups represented by Formulae 3a to 3k below:

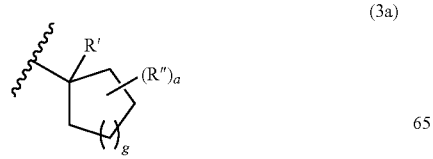

(3a)

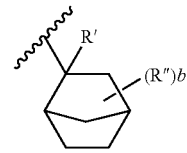

(3b)

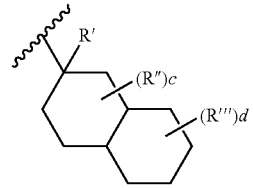

(3c)

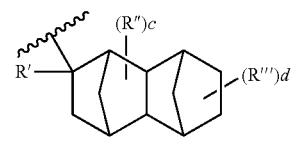

(3d)

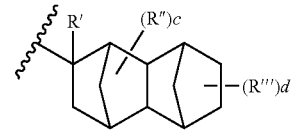

(3e)

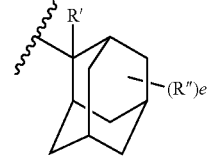

(3f)

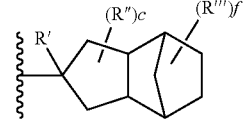

(3g)

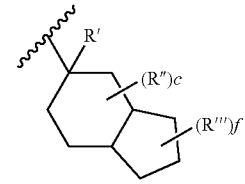

(3h)

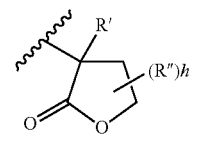

(3i)

(3j)

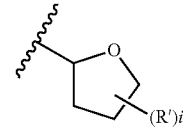

(3k)

wherein R', R" and R'" are each independently a hydrogen atom or a C1-C10 alkyl group, a and e are each independently an integer of 0 to 15, b is an integer of 0 to 11, c and d are each independently an integer of 0 to 9, f is an integer of 0 to 7, g and i are each independently an integer of 0 to 6, h is an integer of 0 to 4, 0≤c+d≤17, and 0≤c+f≤15.

6. The resist composition of claim 1, wherein n is a positive integer and $R_4$ is selected from the group consisting of: a C1-C20 fluoroalkyl group; and a C1-C20 alkyl group, a C3-C14 monocyclic cycloalkyl group, a C8-C18 dicyclic cycloalkyl group, a C10-C30 tricyclic cycloalkyl group, a C10-C30 tetracyclic cycloalkyl group, a (C1-C10 alkyl)carbonyl group, a (C3-C30 cycloalkyl)carbonyl group, a (C1-C10 alkyl)carboxyl group, a (C1-C20 alkoxy)alkyl group, and a (C3-C30 cycloalkyl)oxyalkyl group comprising at least one functional group selected from the group consisting of a fluoro group and a fluoroalkyl group.

7. The resist composition of claim 1, wherein n is a positive integer and $R_4$ is selected from the group consisting of a trifluoromethyl group, a di(trifluoromethyl)isopropyl group, a pentafluoroethyl group, and a heptafluoropropyl group.

8. The resist composition of claim 1, wherein o is a positive integer and $R_5$ is an acid labile group selected from the group consisting of

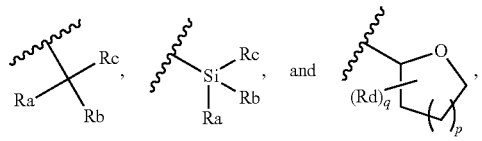

wherein $R_a$, $R_b$, $R_c$, and $R_d$ are each independently selected from the group consisting of a C1-C10 alkyl group, a C3-C14 monocyclic cycloalkyl group, a C8-C20 dicyclic cycloalkyl group, a C10-C30 tricyclic cycloalkyl group, a C10-C30 tetracyclic cycloalkyl group, a (C1-C5 alkyl)cycloalkyl group, a hydroxyalkyl group, a C1-C10 alkoxy group, a (C1-C8 alkoxy)alkyl group, an acetyl group, an acetylalkyl group, a carboxyl group, a (C1-C5 alkyl)carboxyl group, and a (C3-C10 cycloalkyl)carboxyl group or fused together between adjacent groups to form a C6-C18 saturated or unsaturated hydrocarbon ring or a C5-C18 heterocyclic group, p is an integer of 0 to 3, and q is an integer of 0 to 5, or selected from the group consisting of a C1-C10 alkyl group, a C3-C14 monocyclic cycloalkyl group, a C8-C18 dicyclic cycloalkyl group, a C10-C30 tricyclic cycloalkyl group, a C10-C30 tetracyclic cycloalkyl group, a formyl group, a (C1-C20 alkyl)carbonyl group, a (C3-C30 cycloalkyl)carbonyl group, a carboxyl group, a (C1-C10 alkyl)carboxyl group, a (C3-C18 cycloalkyl)carboxyl group, and a (C1-C10 alkyl)carboxyalkyl group comprising the acid labile group.

9. The resist composition of claim 1, wherein o is a positive integer and $R_5$ is selected from the group consisting of a t-butyl group, a trimethylsilyl group, a hydroxy-2-ethyl group, a 1-methoxypropyl group, a 1-methoxy-1-methylethyl group, a 1-ethoxypropyl group, a 1-ethoxy-1-methylethyl group, a 1-methoxy-1-ethyl group, a 1-ethoxy-1-ethyl group, a t-butoxy-2-ethyl group, a 1-isobutoxy-1-ethyl group, and groups represented by Formulae 3a to 3k below:

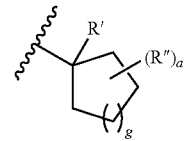

(3a)

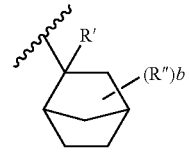

(3b)

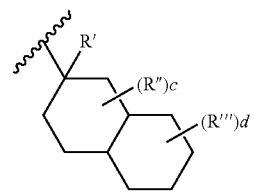

(3c)

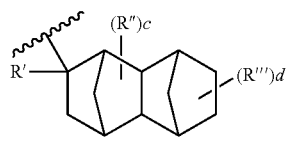

(3d)

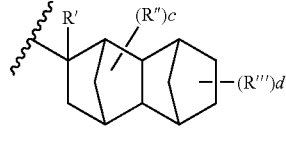

(3e)

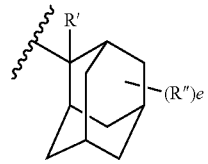

(3f)

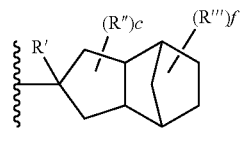

(3g)

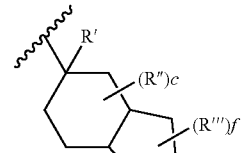

(3h)

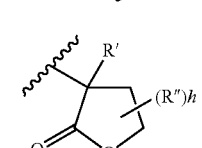

(3i)

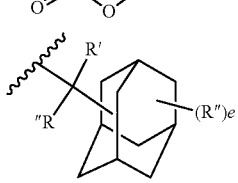

-continued (3k)

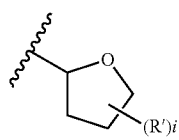

wherein R', R" and R'" are each independently a hydrogen atom or a C1-C10 alkyl group, a and e are each independently an integer of 0 to 15, b is an integer of 0 to 11, c and d are each independently an integer of 0 to 9, f is an integer of 0 to 7, g and i are each independently an integer of 0 to 6, h is an integer of 0 to 4, $0 \le c+d \le 17$, and $0 \le c+f \le 15$.

10. The resist composition of claim 1, wherein in Formula 1, a repeat unit m is comprised in a copolymer of the resist additive in an amount of 5 to 15 mol %.

11. The resist composition of claim 1, wherein the resist additive is selected from the group consisting of compounds represented by Formulae 5 to 10 below:

Formula 5

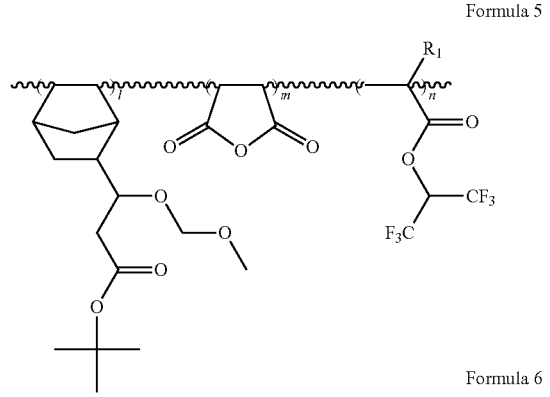

Formula 6

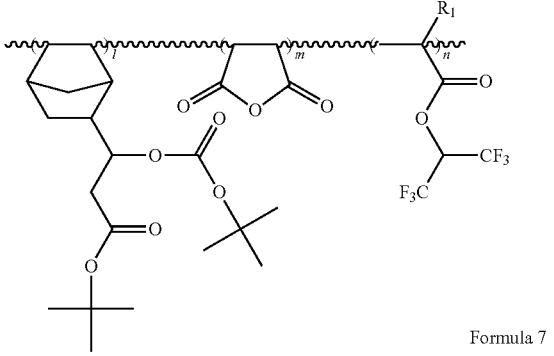

Formula 7

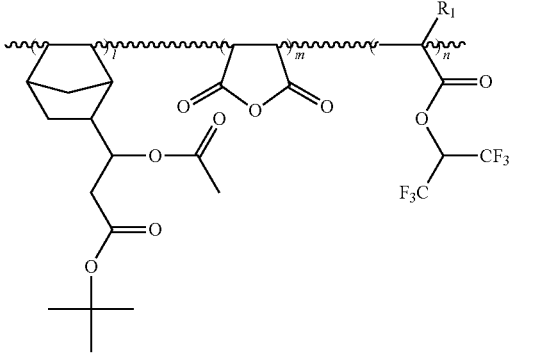

-continued

Formula 8

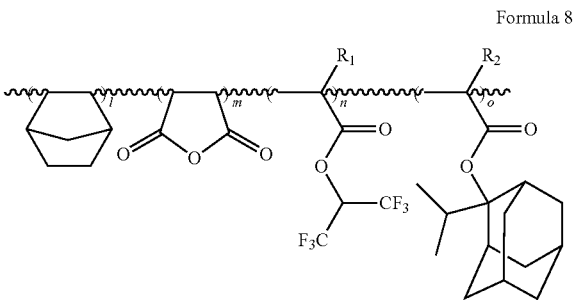

Formula 9

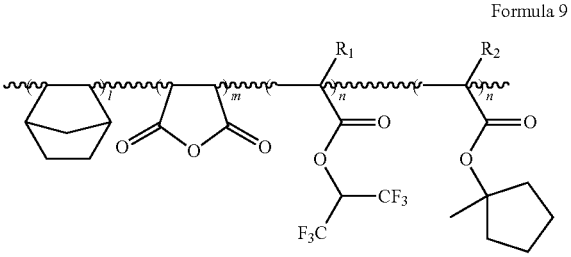

Formula 10

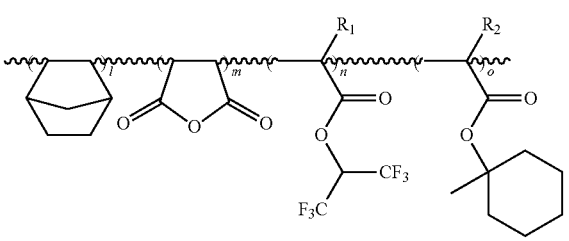

wherein $R_1$ and $R_2$ are each independently a hydrogen atom or a methyl group, and l, m, n and o are respectively numbers of the repeat unit in a backbone, wherein $l+m+n+o=1$, $0<l/(l+m+n+o)<0.9$, $0<m/(l+m+n+o) \le 0.2$, $0<n/(l+m+n+o)<0.9$, and $0 \le o/(l+m+n+o)<0.9$.

12. The resist composition of claim 1, wherein a polystyrene equivalent weight average molecular weight of the resist additive measured using gel permeation chromatography is in the range of 1,000 to 50,000 g/mol.

13. The resist composition of claim 1, wherein a weight average molecular weight/number average molecular weight ratio of the resist additive is in the range of 1 to 5.

14. The resist composition of claim 1, wherein the acid generator comprises at least one compound selected from the group consisting of compounds represented by Formulae 14 and 15 below:

Formula 14

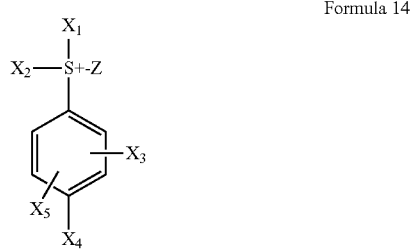

Formula 15

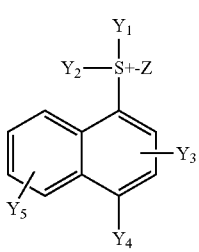

wherein $X_1$, $X_2$, $Y_1$, and $Y_2$ are each independently selected from the group consisting of a hydrogen atom, a C1-C10 alkyl group, an allyl group, a perfluoroalkyl group, a benzyl group, a C6-C30 aryl group, and any combination thereof, wherein $X_1$ and $X_2$ are fused to form a C3-C30 saturated or unsaturated hydrocarbon ring, and $Y_1$ and $Y_2$ are fused to form a C3-C30 saturated or unsaturated hydrocarbon ring, $X_3$, $X_4$, $X_5$, $Y_3$, $Y_4$, and $Y_5$ are each independently selected from the group consisting of a hydrogen atom, a C1-C30 alkyl group, a halogen group, a C1-C30 alkoxy group, a C6-C30 aryl group, a thiophenoxy group, a C1-C30 thioalkoxy group, a C1-C20 alkoxycarbonylmethoxy group, and any combination thereof, Z, which denotes an anion, is $OSO_2CF_3$, $OSO_2C_4F_9$, $OSO_2C_8F_{17}$, $N(CF_3)_2$, $N(C_2F_5)_2$, $N(C_4F_9)_2$, $C(CF_3)_3$, $C(C_2F_5)_3$, $C(C_4F_9)_3$, or a functional group represented by Formula 16 below:

Formula 16

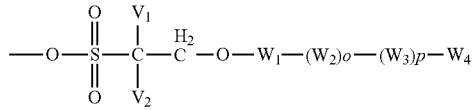

wherein $V_1$ and $V_2$ are each independently a halogen atom, $W_1$ is —(C=O)— or —($SO_2$)—, $W_2$ is a C1-C10 alkanediyl group, $W_3$ is selected from the group consisting of a C3-C30 cycloalkyl group, a C6-C30 aryl group, a C7-C30 aralkyl group, a C6-C30 aryloxy group, a C6-C30 arylthio group, and a C5-C30 heterocyclic group, $W_4$ is selected from the group consisting of a hydrogen atom, a halogen group, a C1-C10 alkyl group, a C1-C10 alkoxy group, a C1-C10 haloalkyl group, a C1-C10 alkylthio group, a C6-C30 aryl group, and any combination thereof, o is an integer of 0 to 1, and p is an integer of 0 to 2.

15. The resist composition of claim 1, wherein the amount of the acid generator is in the range of 0.3 to 10 parts by weight based on 100 parts by weight of solids of the resist composition.

16. The resist composition of claim 1, further comprising an additive selected from the group consisting of an alkali soluble quencher, an acid diffusion quencher, a surfactant, and any mixture thereof.

17. A method of forming a resist pattern, the method comprising:

forming a resist film by coating the resist composition according to claim 1 on a substrate;

heating the resist film, and exposing the resist film to light to form a predetermined pattern; and developing the exposed pattern.

18. The method of claim 17, wherein the exposing is performed using a light source selected from the group consisting of a KrF excimer laser, an ArF excimer laser, an extreme ultraviolet laser, an X-ray, and an electron beam.

\* \* \* \* \*